US006308654B1

United States Patent
Schneider et al.

(10) Patent No.: US 6,308,654 B1
(45) Date of Patent: Oct. 30, 2001

(54) INDUCTIVELY COUPLED PARALLEL-PLATE PLASMA REACTOR WITH A CONICAL DOME

(75) Inventors: Gerhard Schneider, Cupertino; Viktor Shel, Milpitas; Andrew Nguyen, San Jose; Robert W. Wu, Pleasanton; Gerald Z. Yin, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/734,015

(22) Filed: Oct. 18, 1996

(51) Int. Cl.[7] .................................................. C23C 16/00
(52) U.S. Cl. ........................................ 118/723 I; 156/345
(58) Field of Search .......................... 118/723 I, 723 IR, 118/723 AN, 728, 723 R, 723 E, 723 ER; 156/345; 315/111.21, 111.51; 204/298.06, 298.34

(56) References Cited

U.S. PATENT DOCUMENTS

| 4,626,312 | 12/1986 | Tracy | 156/345 |
|---|---|---|---|
| 4,871,421 | 10/1989 | Ogle et al. | 156/643 |
| 4,892,753 | 1/1990 | Wang et al. | 427/38 |
| 4,948,458 | 8/1990 | Ogle | 156/643 |
| 4,982,140 | 1/1991 | Witting | 315/248 |

(List continued on next page.)

FOREIGN PATENT DOCUMENTS

| 552491-A1 | 7/1993 | (EP) . |
|---|---|---|
| 596551-A1 | 5/1994 | (EP) . |
| 601468-A1 | 6/1994 | (EP) . |
| 680072-A2 | 11/1995 | (EP) . |
| 690666-A1 | 1/1996 | (EP) . |
| 792091-A1 | 8/1997 | (EP) . |
| 6-196446 | * 7/1994 | (JP) . |
| 97-3330 | 9/1997 | (WO) . |

OTHER PUBLICATIONS

Patent Abstracts of Japan, 06–179985, Jun. 28, 1994.
Patent Abstracts of Japan, 62–195124, Aug. 27, 1987.
Patent Abstracts of Japan, 03–030424, Feb. 8, 1991.
Lii, "Etching", *ULSI Technology*, eds. Chang et al. (McGraw–Hill, 1996), pp. 330–333.
Chapman, *Glow Discharge Processes: Sputtering and Plasma Etching* (Wiley–Interscience, 1980), pp. 156–171.
Copy of the Original filed drawings of U. S. Patent application 08/811893 (U.S. Patent 5,964,949) Copy.*

*Primary Examiner*—Gregory Mills
*Assistant Examiner*—Luz L. Alejandro
(74) *Attorney, Agent, or Firm*—Charles Guenzer

(57) ABSTRACT

A plasma reactor appropriate for fabrication, especially etching, of semiconductor integrated circuits and similar processes in which the chamber has a top comprising a truncated conical dome and, preferably, a counter electrode disposed at the top of the conical dome. An RF coil is wrapped around the conical dome to inductively couple RF energy into a plasma within the chamber dome. The dome temperature can be controlled in a number of ways. A heat sink can be attached to the outside rim of the dome. A rigid conical thermal control sheath can be fit to the outside of the dome, and any differential thermal expansion between the two is accommodated by the conical geometry, thus assuring good thermal contact. The rigid thermal control sheath can include resistive heating, fluid cooling, or both. Alternatively, a flexible resistive heater can be wrapped around the dome inside the RF coil. The resistive heater includes a heater wire wound in a serpentine path that has straight portions overlying and perpendicular to the RF coil but has bends located away from the RF coil. The path prevents the heater wire from shorting the azimuthal electric field induced by the RF coil and also acts as a Faraday shield preventing capacitive coupling from the coil into the chamber plasma.

31 Claims, 20 Drawing Sheets

U.S. PATENT DOCUMENTS

| | | | |
|---|---|---|---|
| 5,346,578 | 9/1994 | Benzing et al. | 156/345 |
| 5,401,350 * | 3/1995 | Patrick et al. | 156/345 |
| 5,405,480 | 4/1995 | Benzing et al. | 156/345 |
| 5,436,528 | 7/1995 | Paranjpe | 315/111.51 |
| 5,477,975 | 12/1995 | Rice | 216/68 |
| 5,494,522 | 2/1996 | Moriya et al. | 118/719 |
| 5,522,934 * | 6/1996 | Suzuici et al. | 118/723 AN |
| 5,529,657 * | 6/1996 | Ishii | 156/345 |
| 5,556,501 | 9/1996 | Collins et al. | 156/345 |
| 5,573,595 | 11/1996 | Dible | 118/723 MP |
| 5,589,041 * | 12/1996 | Lantsman | 204/192.33 |
| 5,753,044 | 5/1998 | Hanawa et al. | 118/728 IR |
| 5,964,949 * | 10/1999 | Savas | 118/723 I |

* cited by examiner

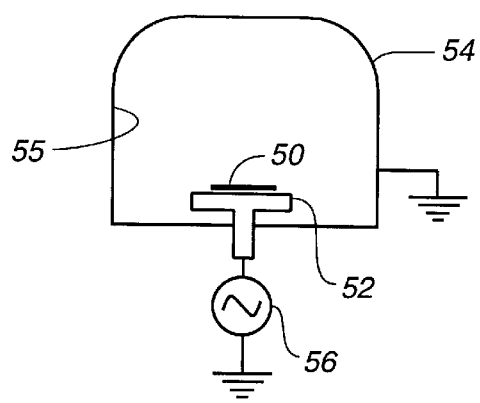
FIG._1
(PRIOR ART)
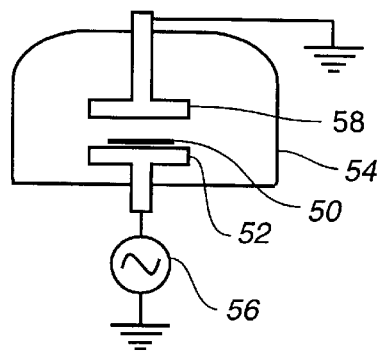
FIG._2
(PRIOR ART)
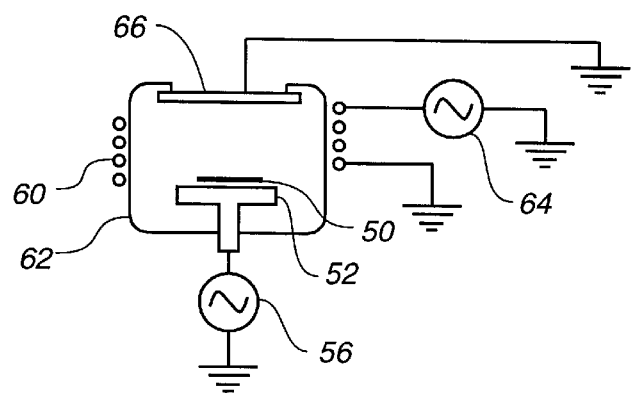
FIG._3
(PRIOR ART)
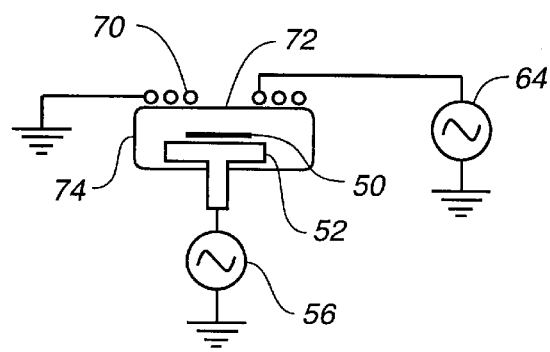
FIG._4
(PRIOR ART)

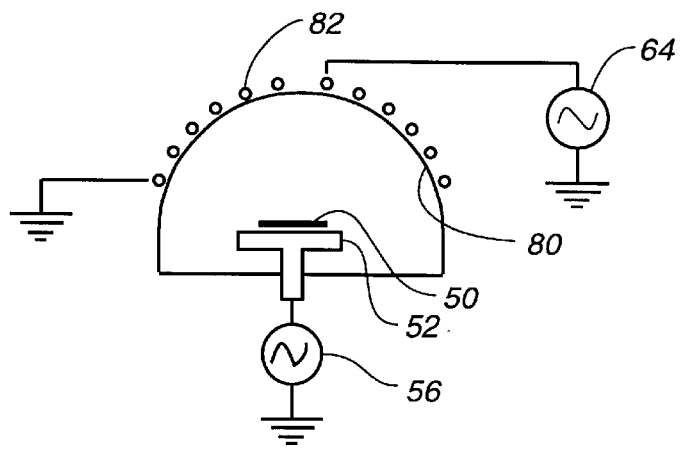
FIG._5
(PRIOR ART)
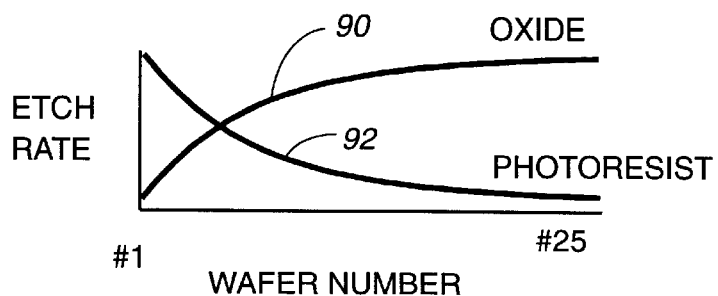
FIG._6
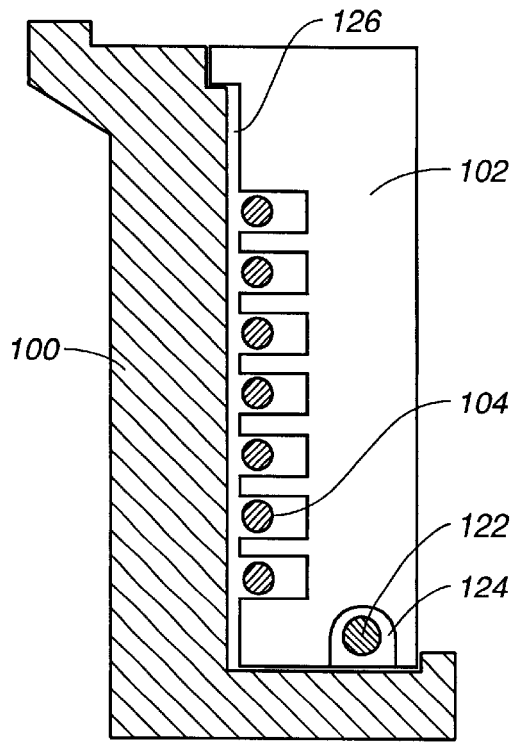
FIG._8
(PRIOR ART)

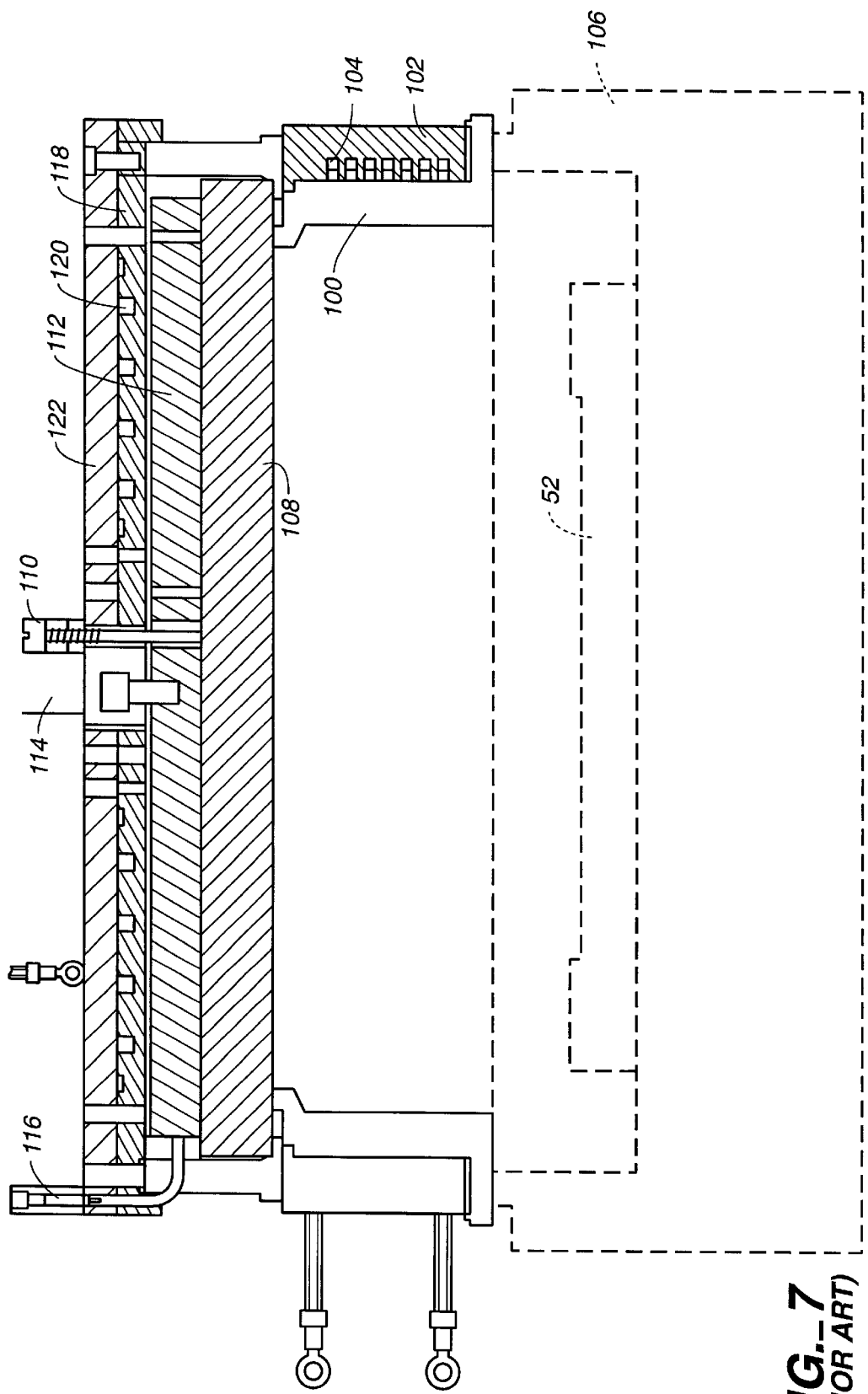
FIG._7 (PRIOR ART)

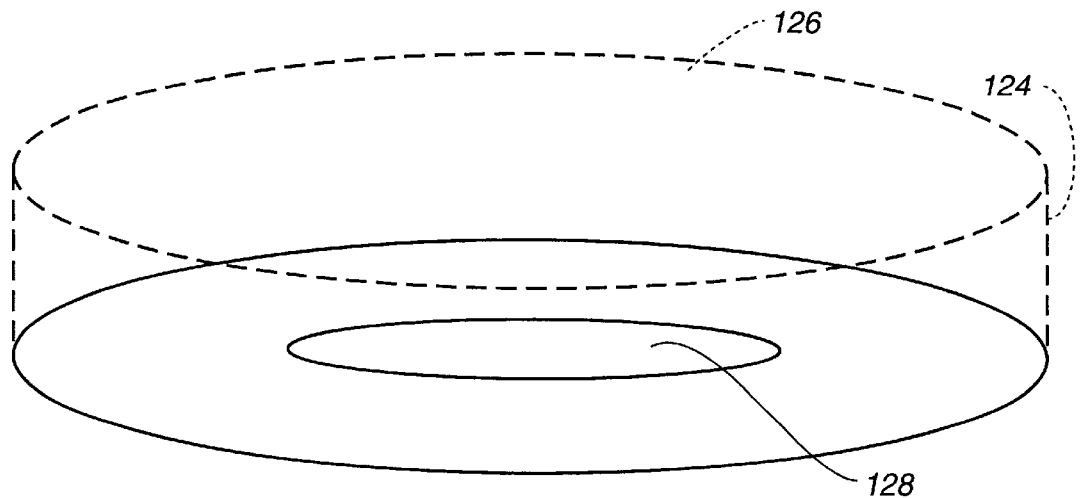
FIG._9
(PRIOR ART)
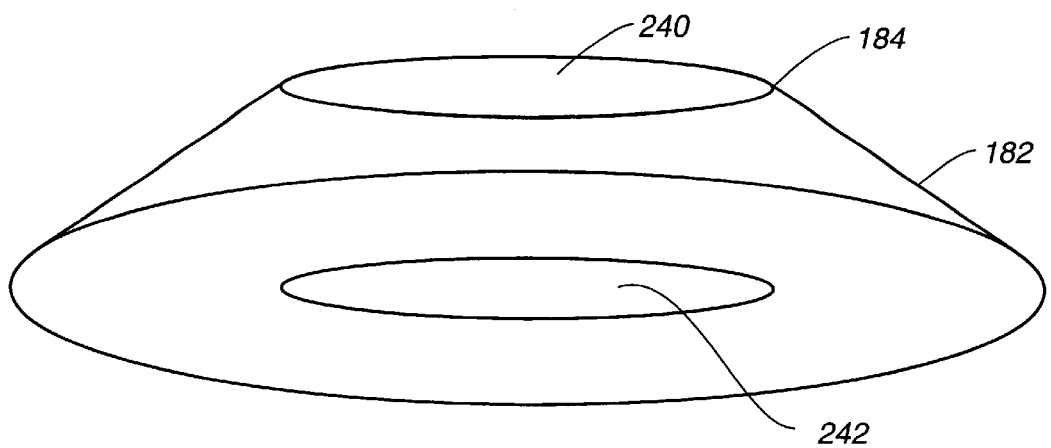
FIG._14

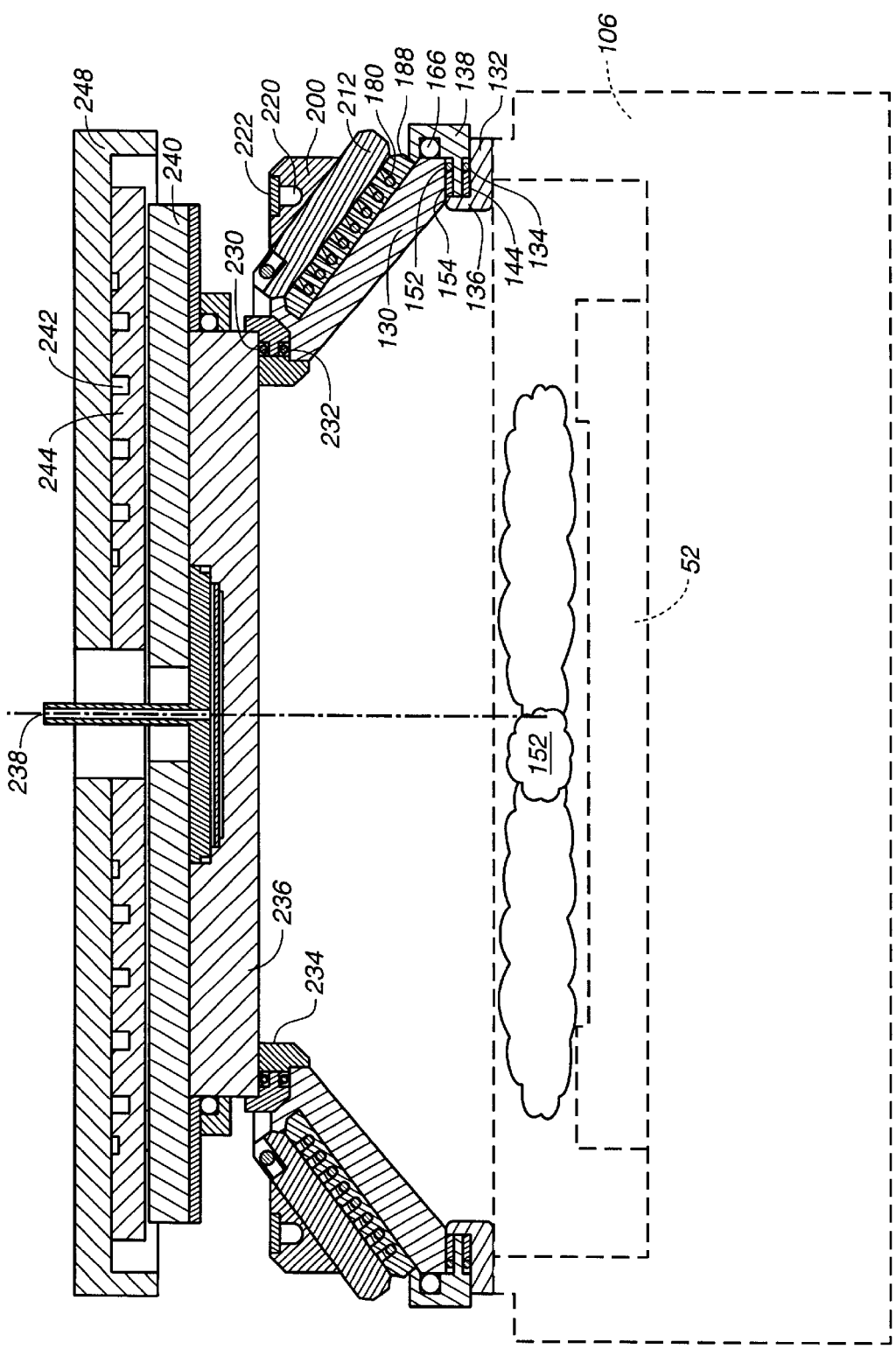
FIG._10

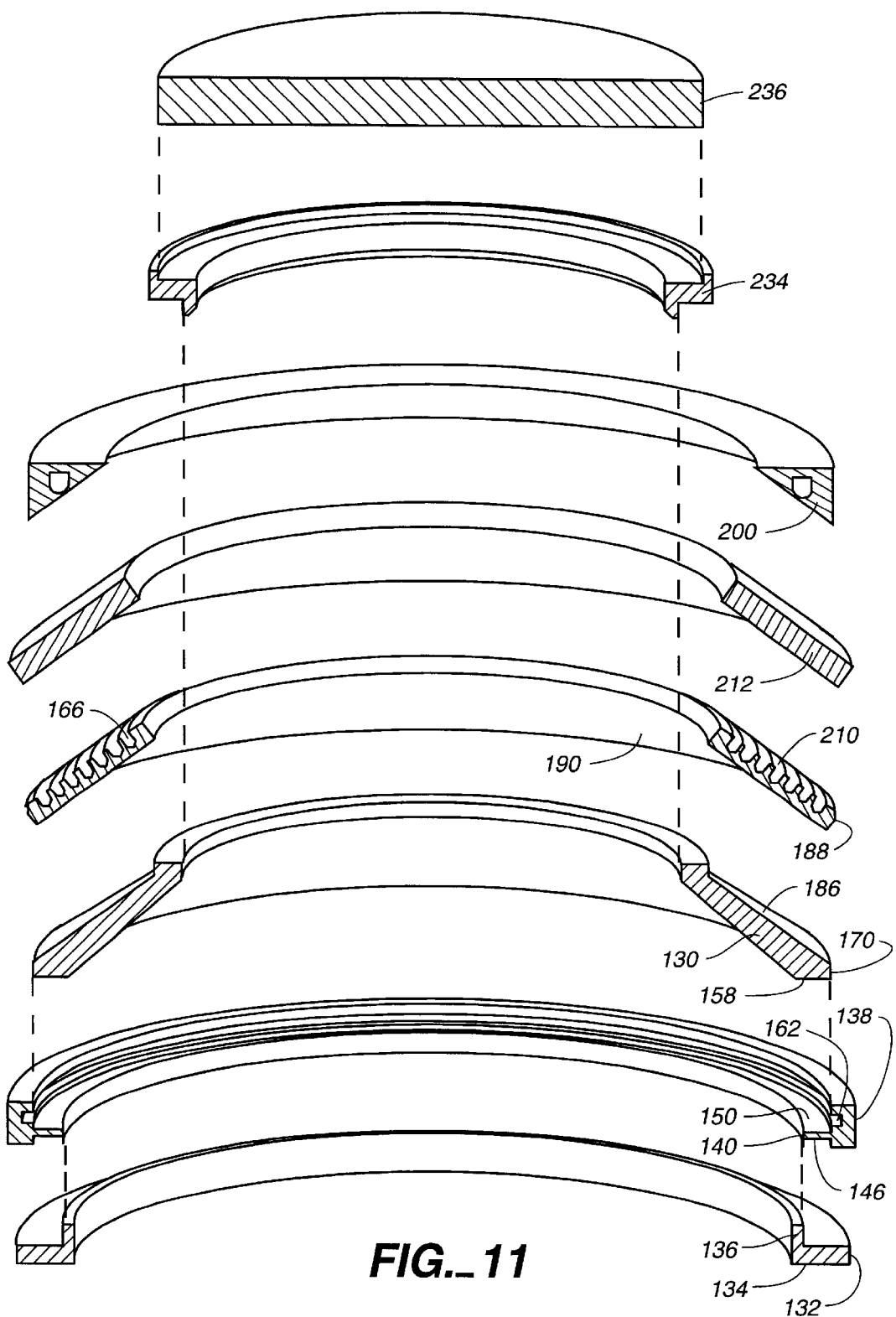
FIG._11

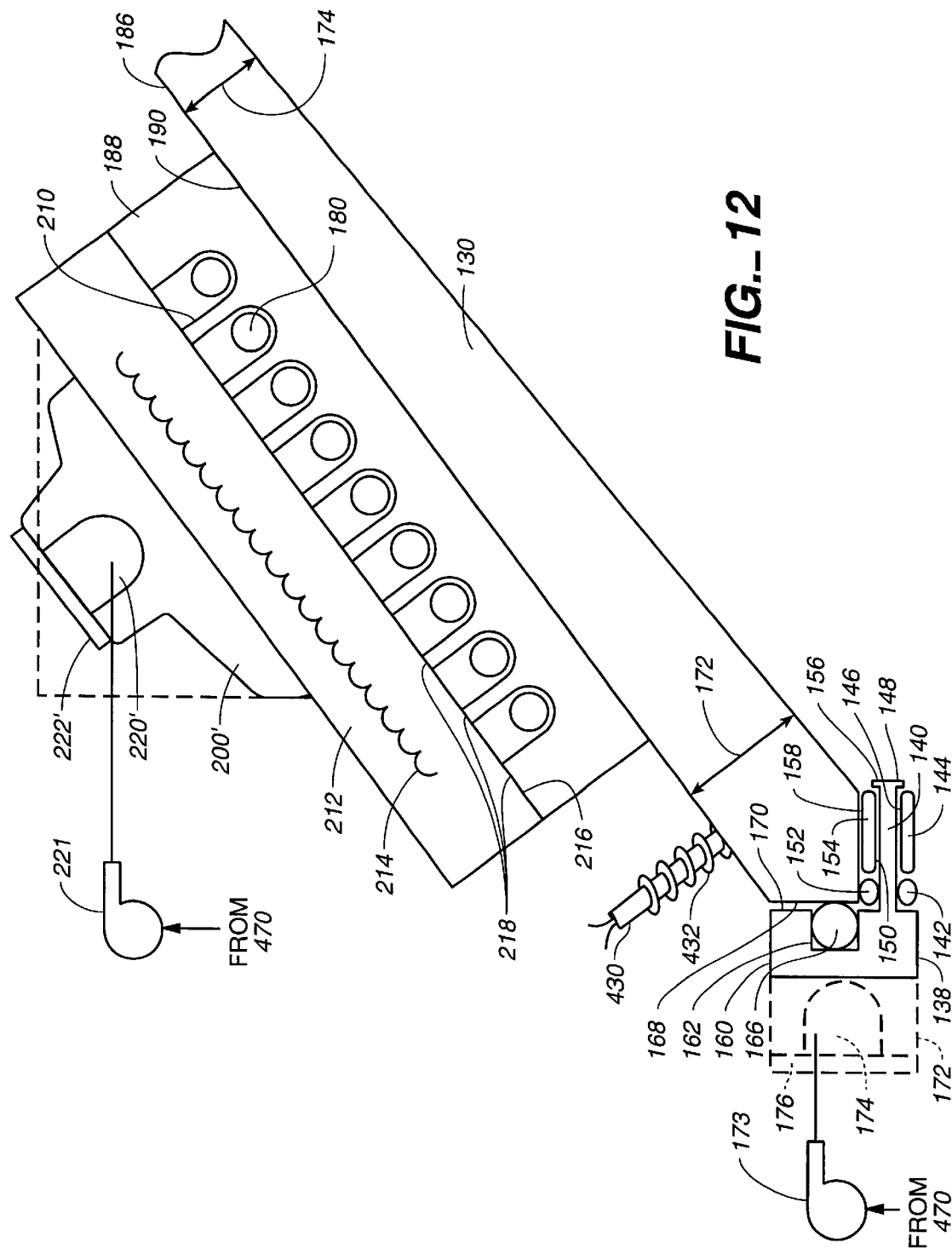
FIG._12

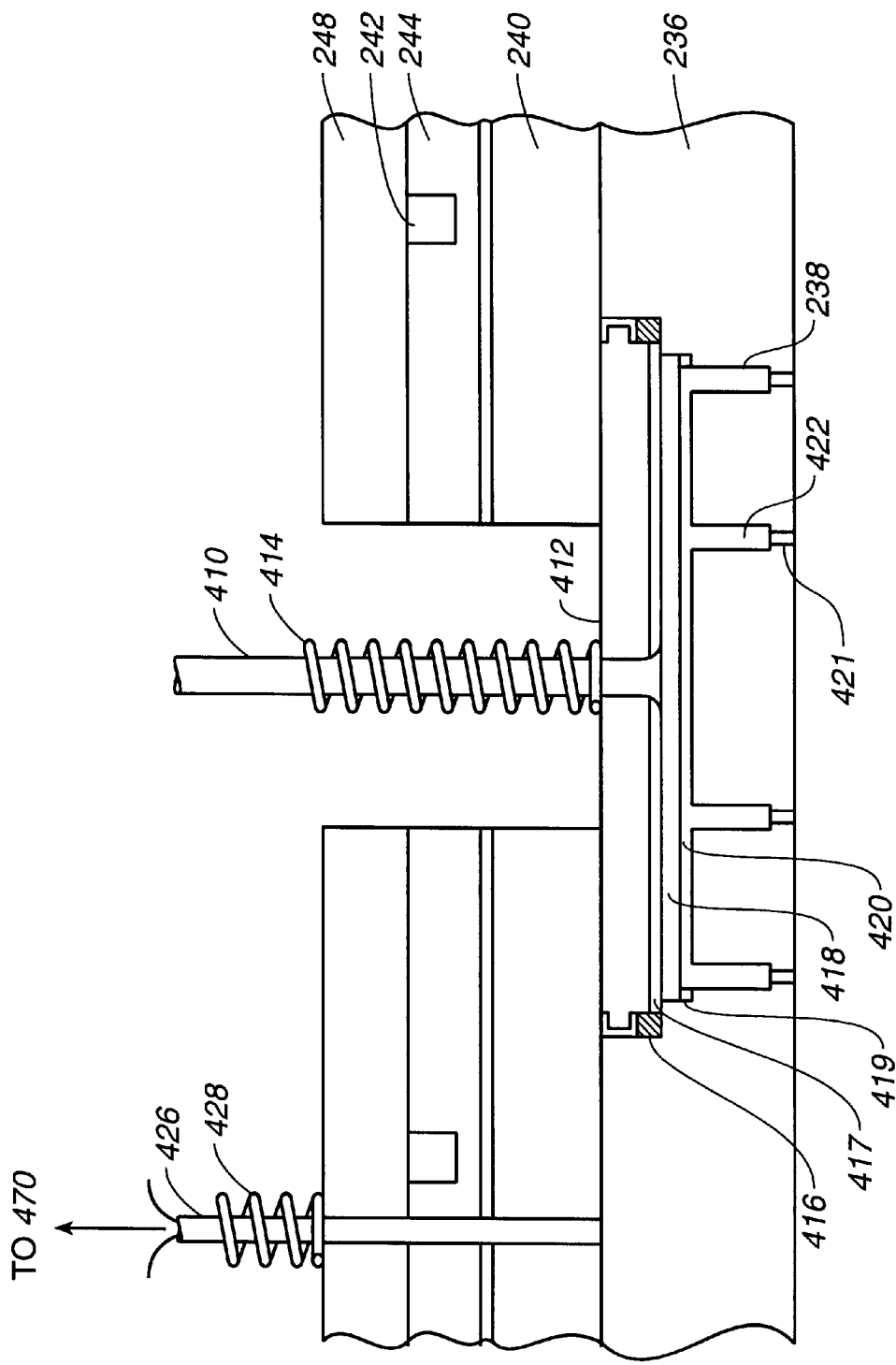
FIG._13

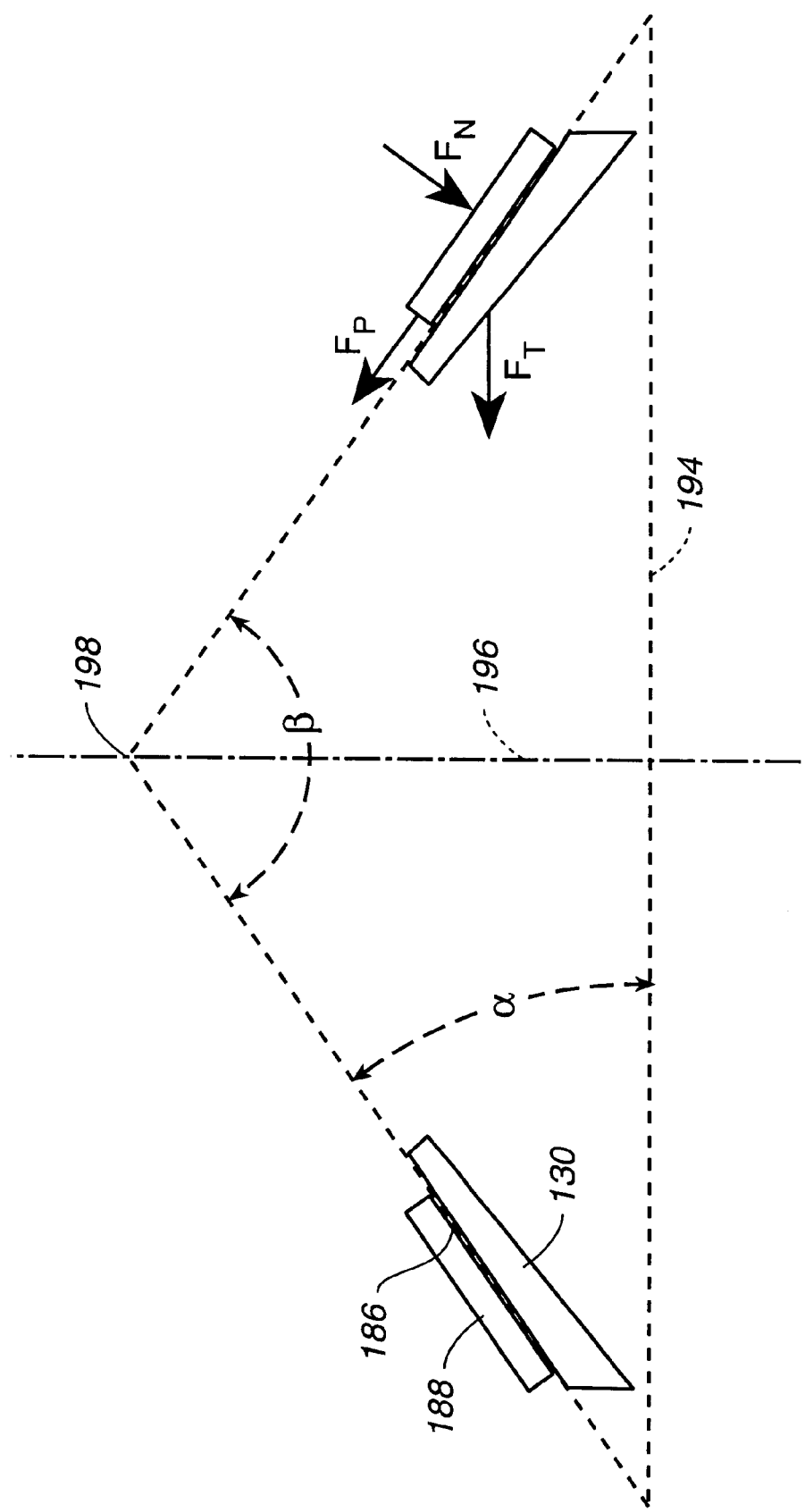
FIG._15

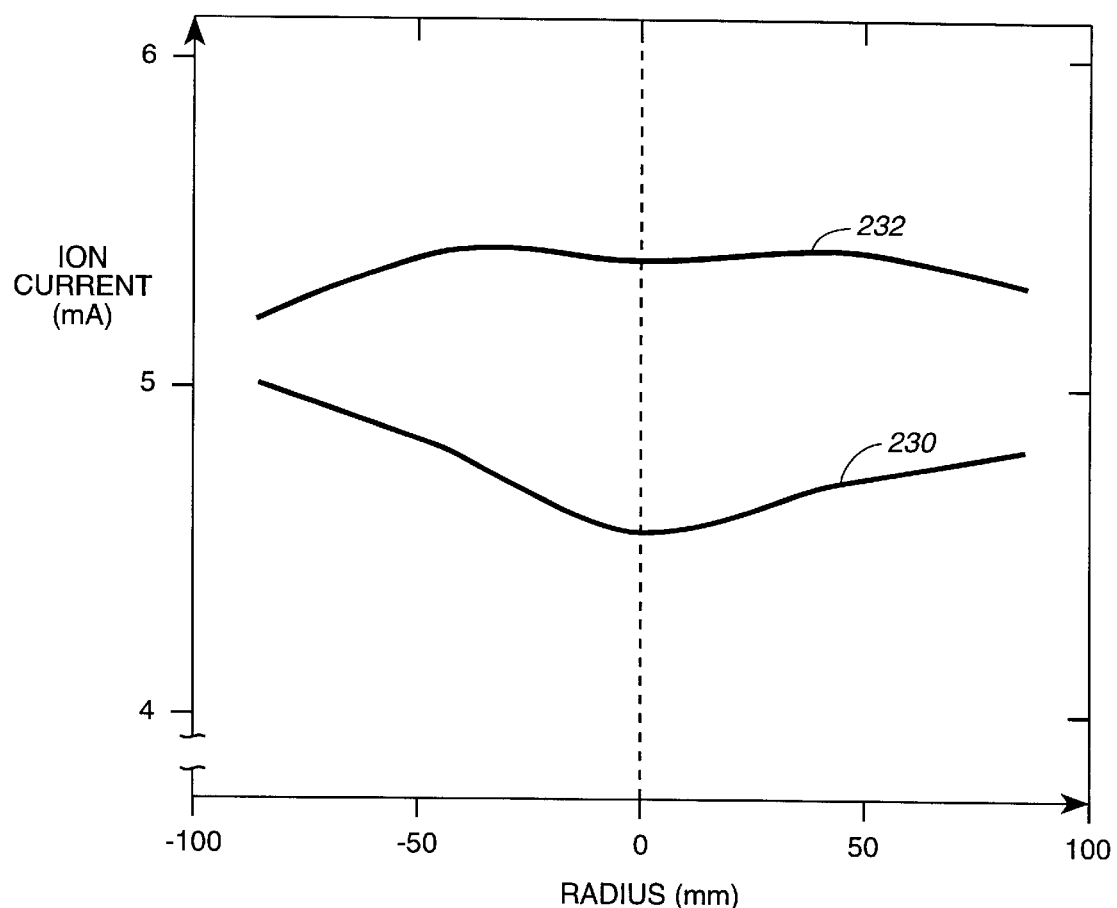
FIG._16

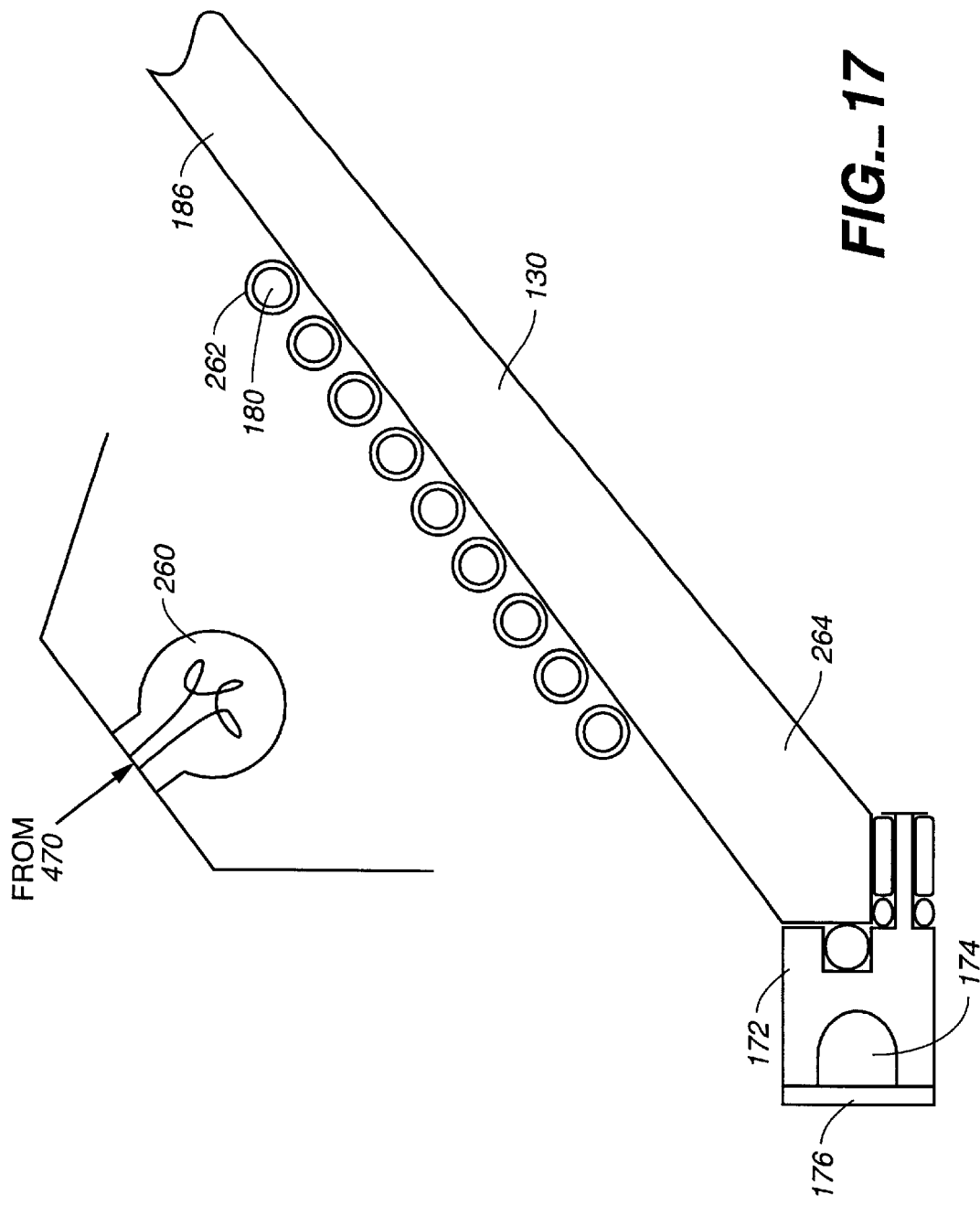
FIG._17

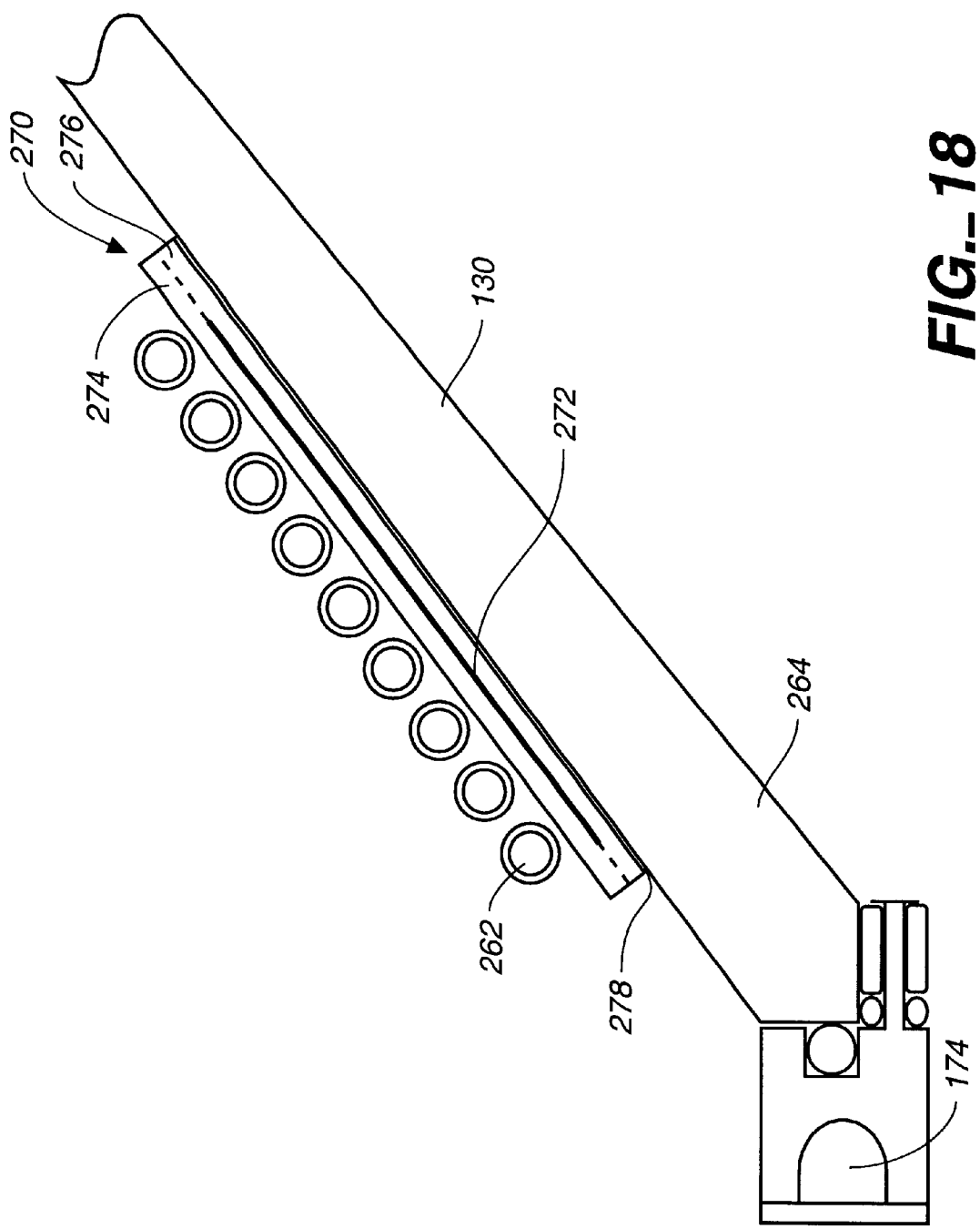

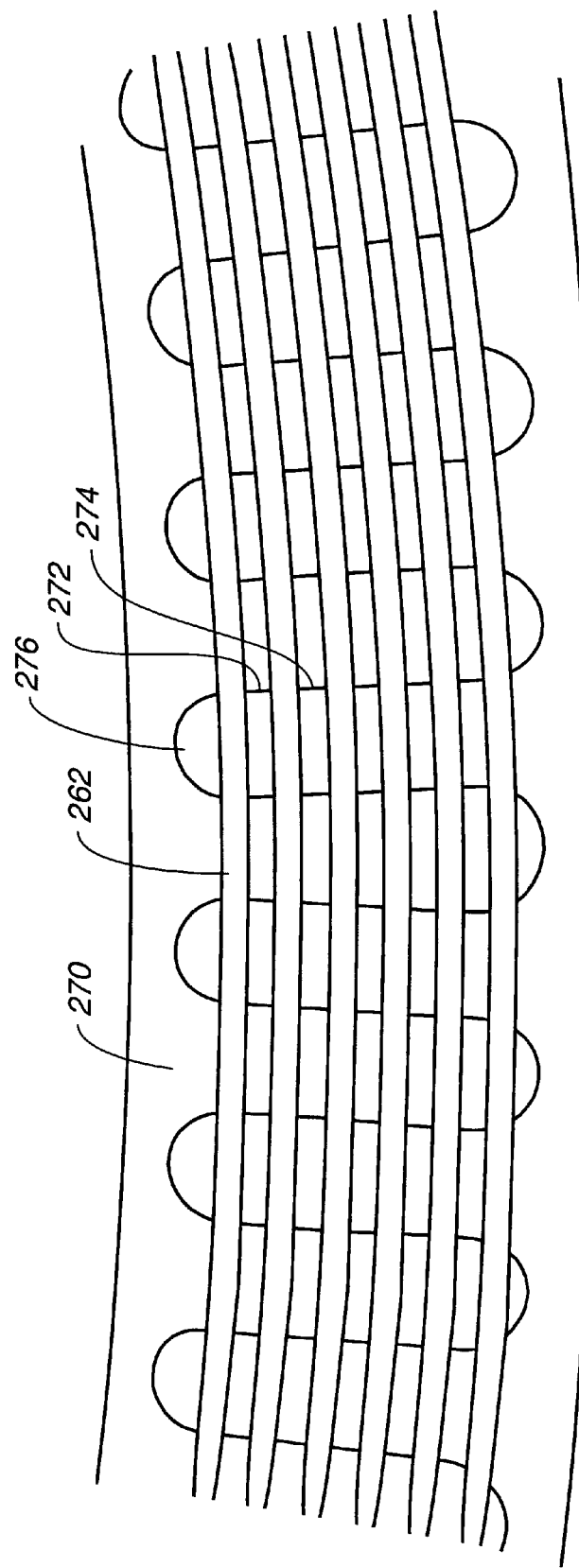
FIG._19

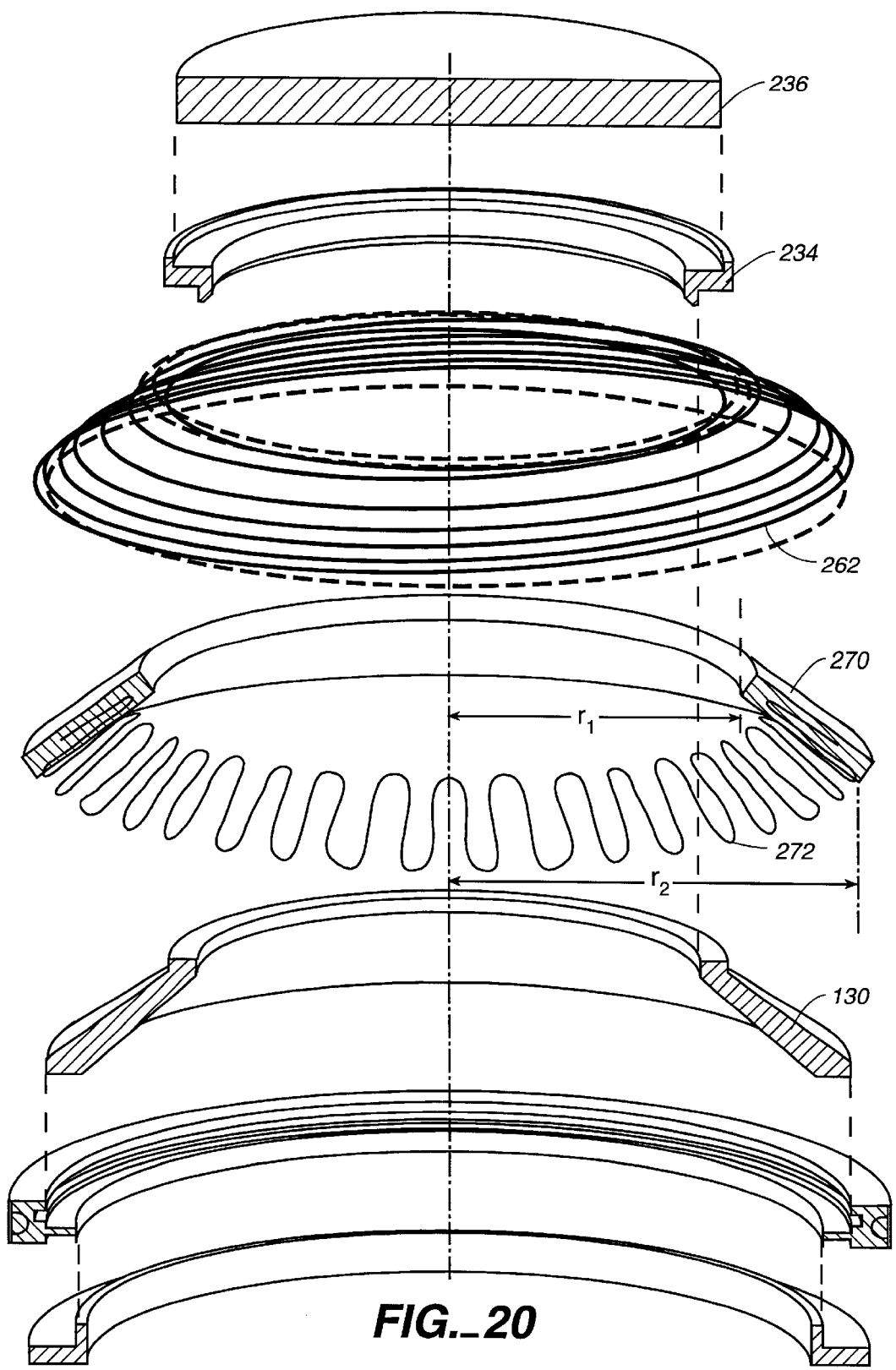
FIG._20

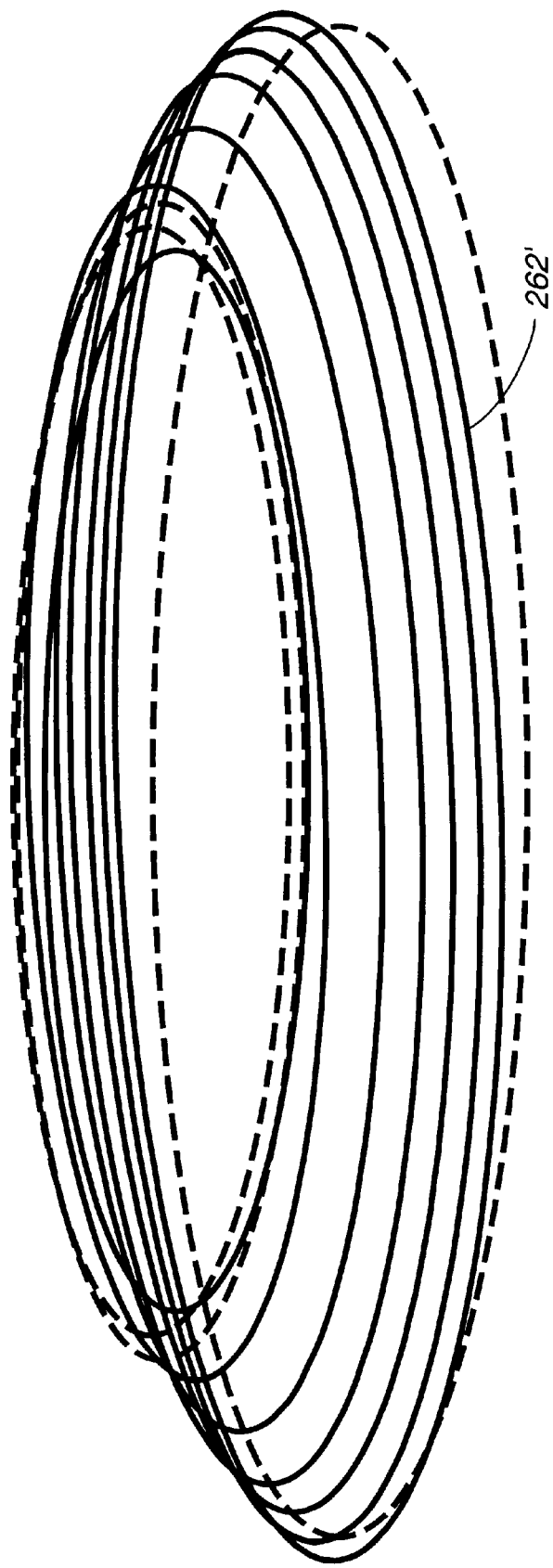
FIG._21

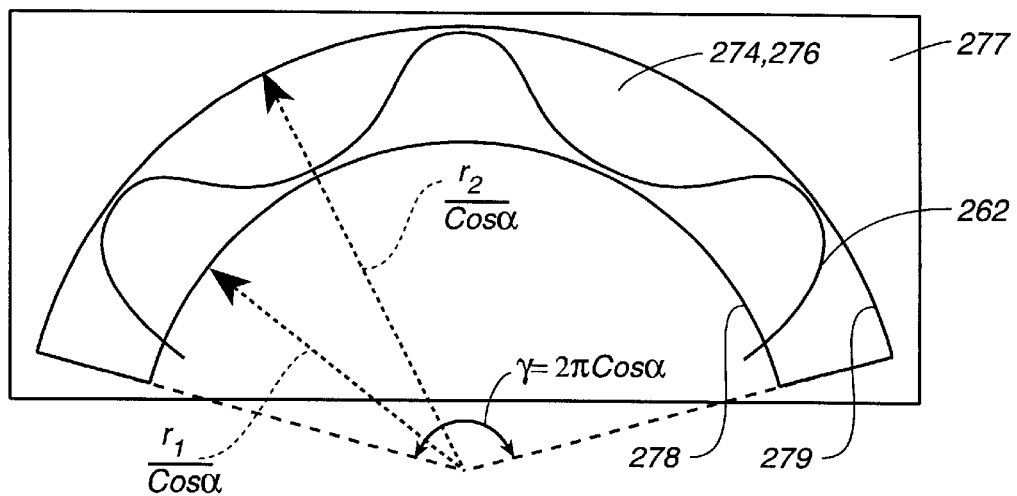
FIG._22
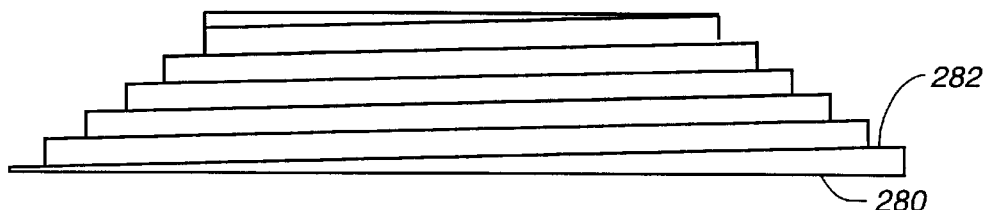
FIG._23
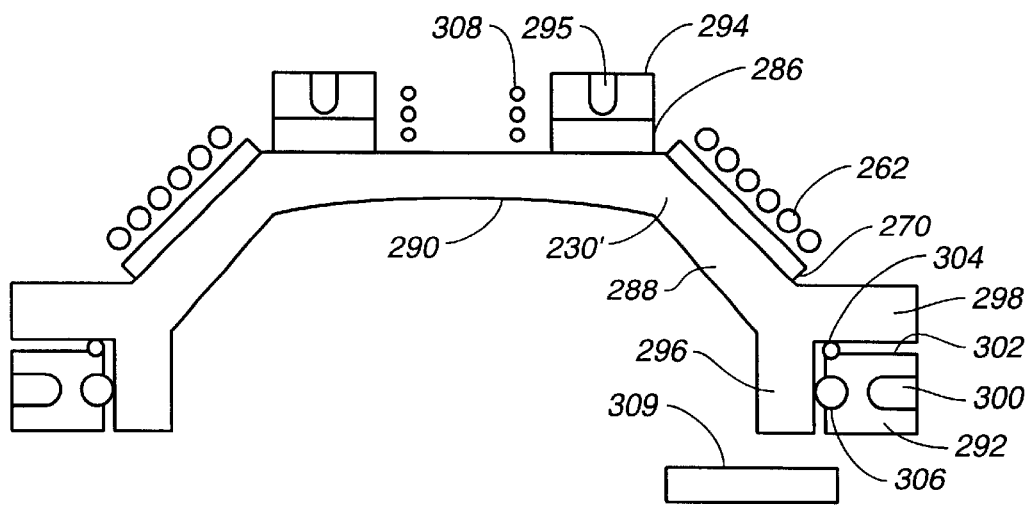
FIG._24

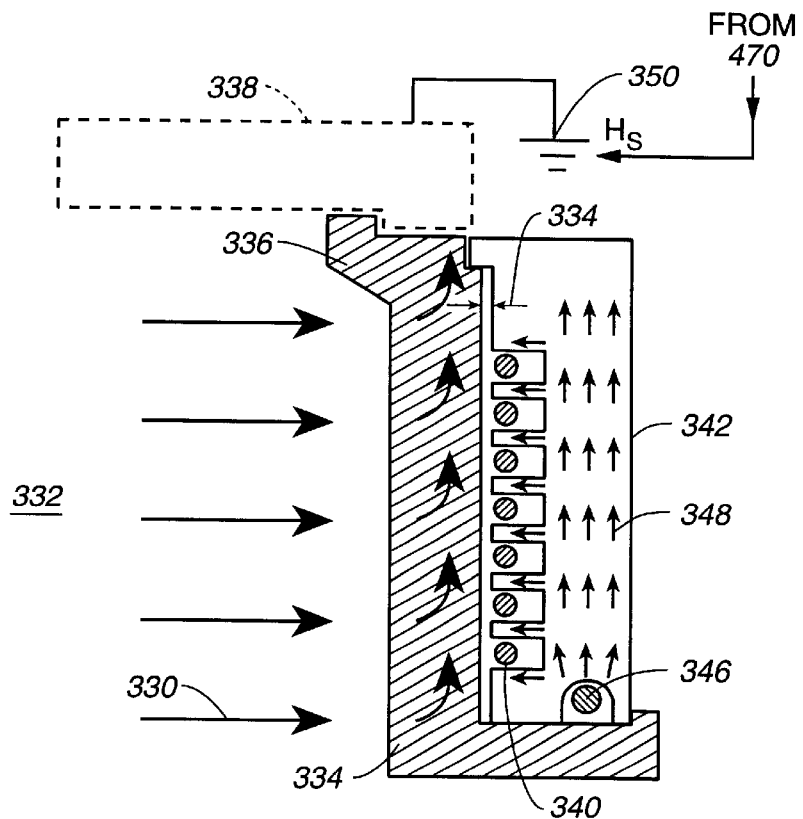
FIG._25
(PRIOR ART)
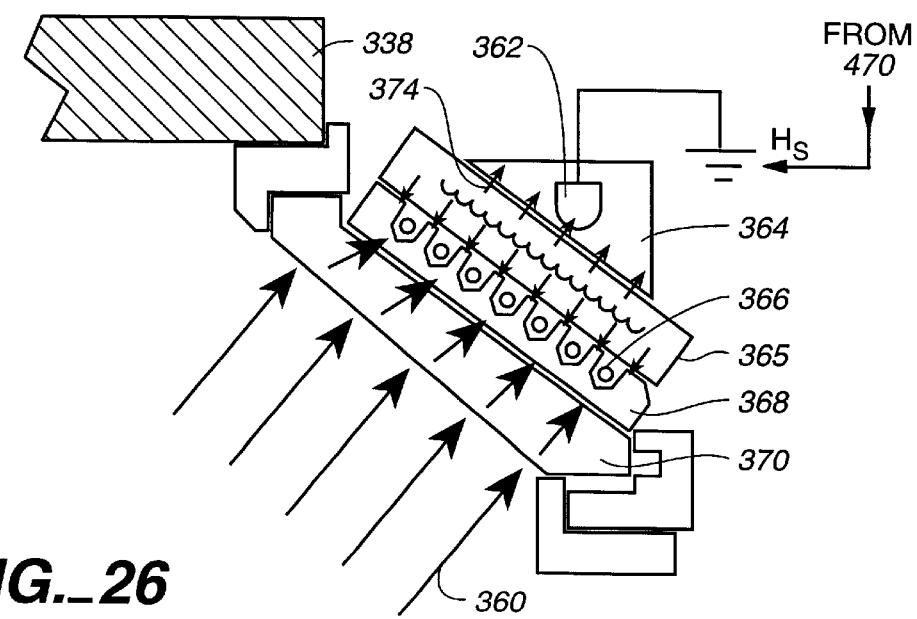
FIG._26

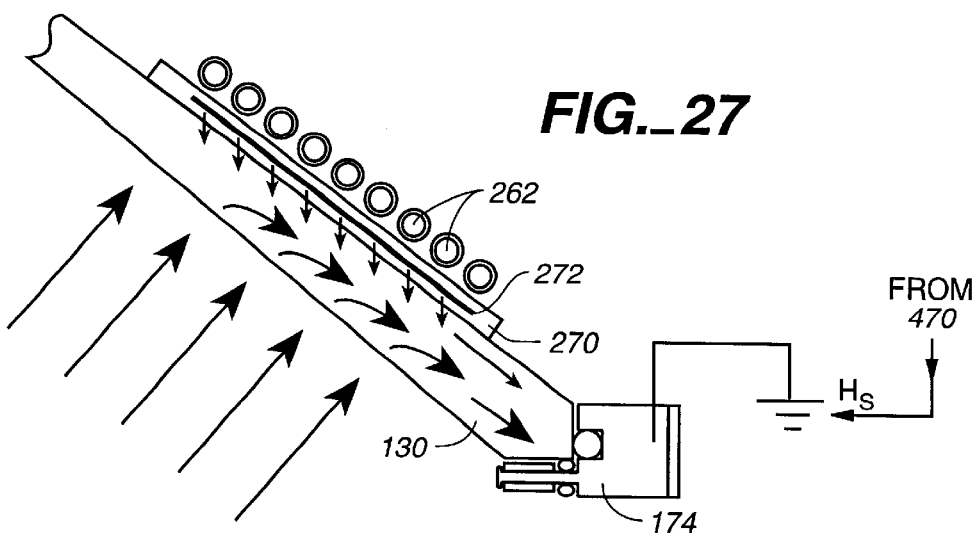
FIG._27
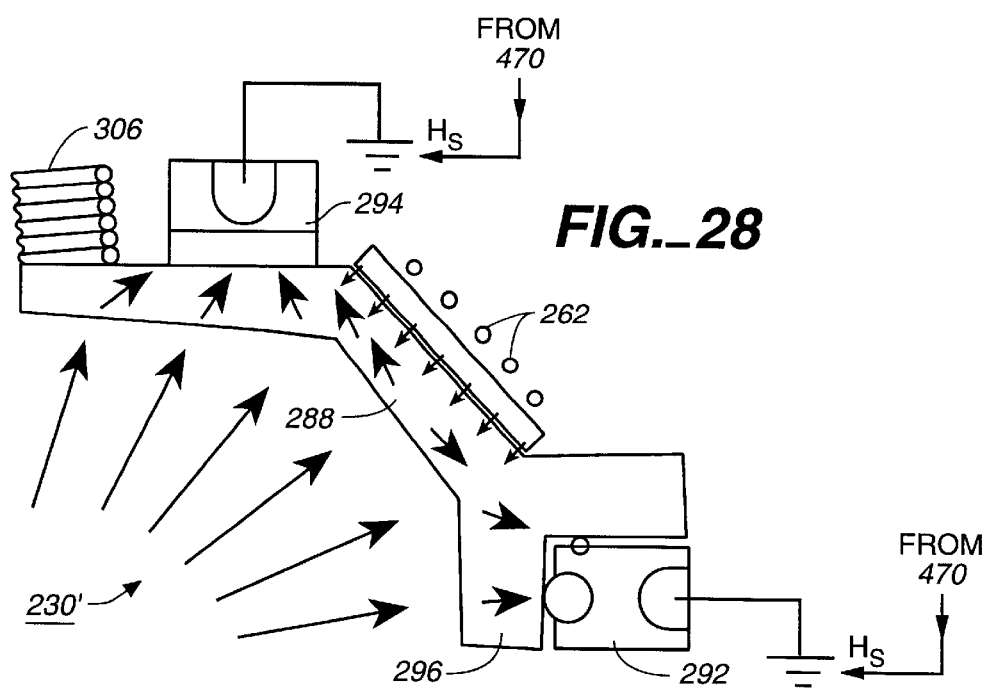
FIG._28
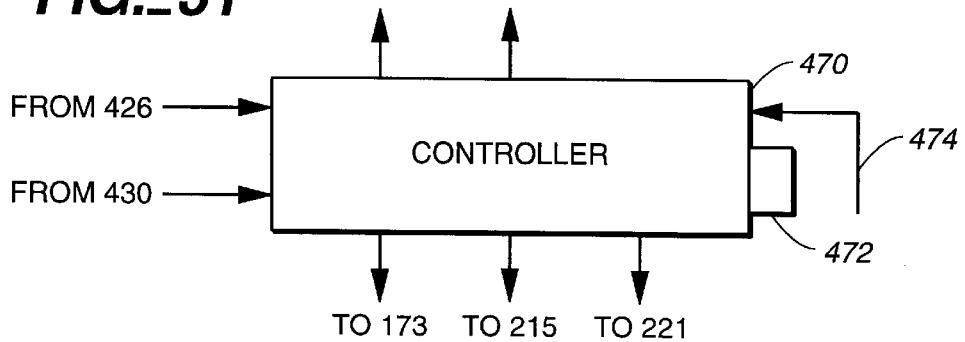
FIG._31

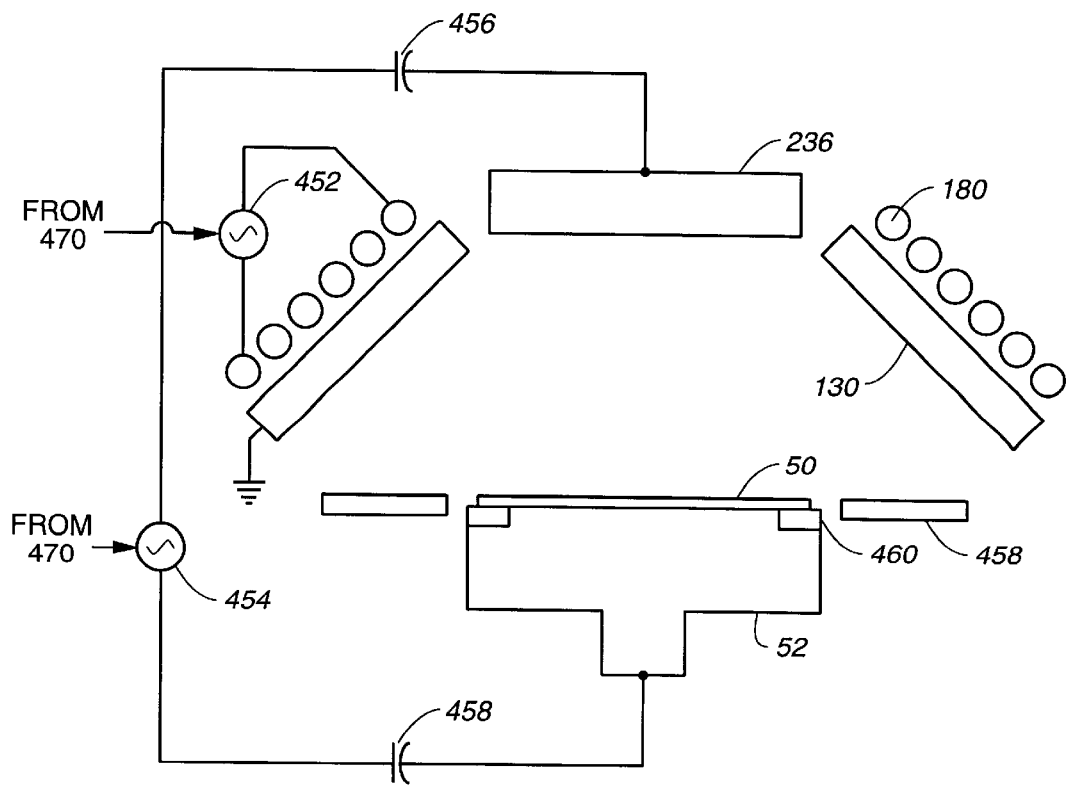
FIG._29
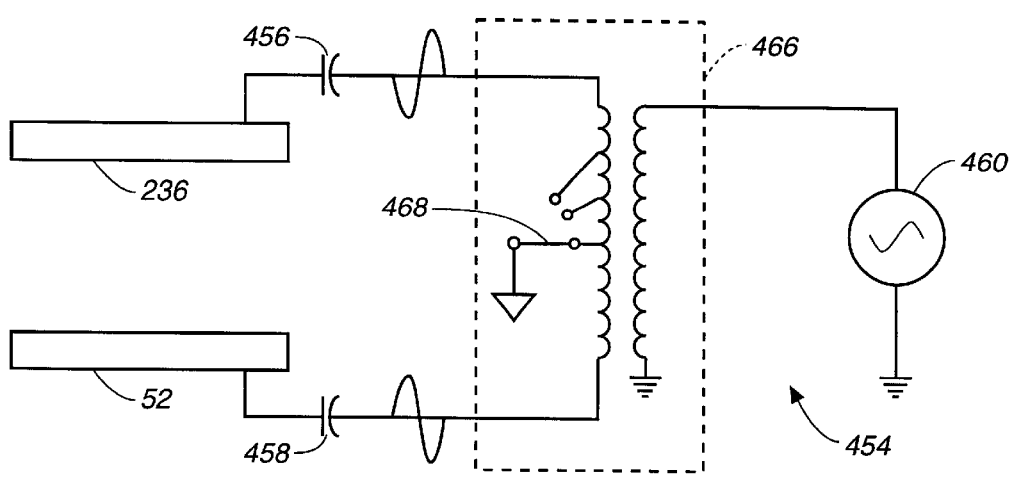
FIG._30

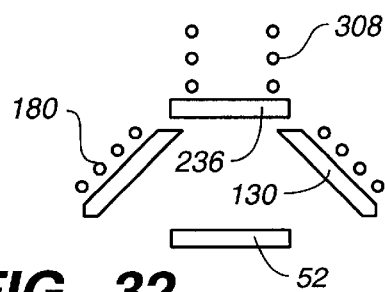
FIG._32
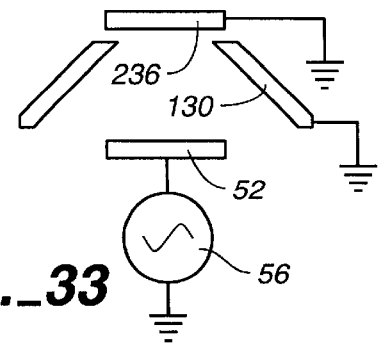
FIG._33
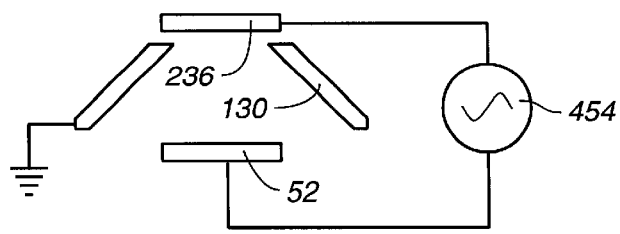
FIG._34
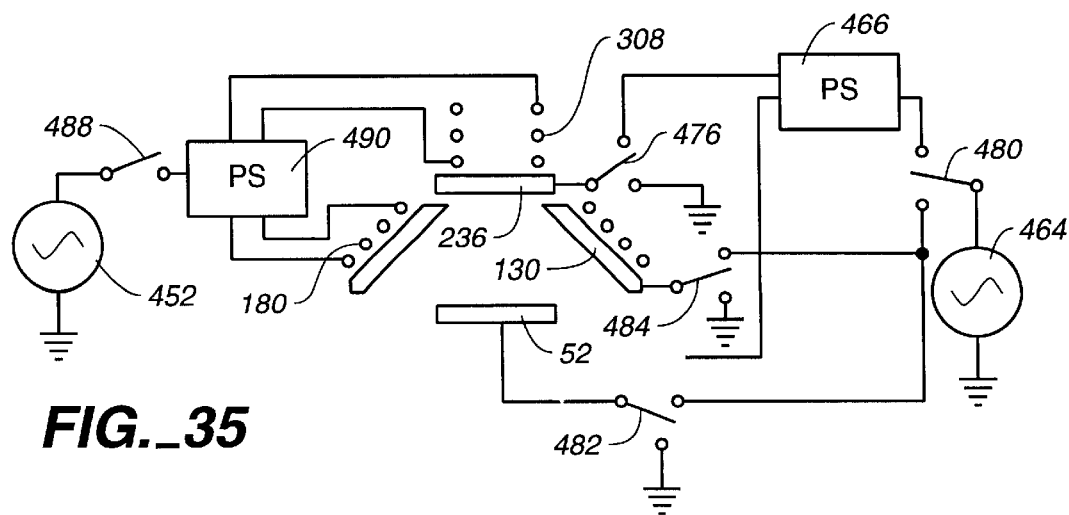
FIG._35

INDUCTIVELY COUPLED PARALLEL-PLATE PLASMA REACTOR WITH A CONICAL DOME

FIELD OF THE INVENTION

The invention generally relates to equipment for the fabrication of semiconductor integrated circuits and for similar processes. In particular, the invention relates to the chamber shape and to the heating and cooling of the reaction chamber for the processing of semiconductors and to controlling the temperature of the chamber surface exposed to the process in such chambers while simultaneously providing electrical inductive and capacitive effects in the chamber.

BACKGROUND ART

The fabrication of silicon integrated circuits was originally based upon thermally activated processes for both the deposition of material layers and their subsequent etching to form horizontally defined features. In a thermal process, the uniformity of deposition is dependent on the temperature of surfaces exposed to the process, and variations in the temperature cause a variation in the rate of the process. Such temperature dependence detracts from process repeatability. Because of the increasing complexity and decreasing feature sizes, more and more semiconductor processing is being performed in plasma reaction chambers. The plasma, rather than equilibrium heat, provides the necessary activation energy for various types of chemical processes and physical processes (sputter deposition and sputter cleaning), while still maintaining the silicon wafer at moderate temperatures so that deleterious thermally driven subsidiary effects are avoided. That is, an increased number of fabrication steps can be performed without producing deleterious effects due to temperature, both the maximum temperature and the integrated thermal profile.

Some early plasma reactors, particularly for etching and chemical vapor deposition (CVD) of single wafers, resemble the reactor illustrated in FIG. 1. A wafer 50 is supported on a pedestal 52 enclosed within a vacuum chamber 54 having metallic walls 55, which are grounded. An RF electrical power supply 56 is connected to the pedestal 52 to excite a plasma of the gas supplied into the interior of the chamber 54. The grounded chamber walls 55 act as a counter electrode to the pedestal 52. The plasma-excited gas acts upon the wafer 50 to either etch it or to deposit a product of a plasma-activated reaction upon it. The pedestal 50 and chamber walls 55 act as two electrodes to capacitively couple RF energy into the plasma.

The geometry dictates that the RF-driven pedestal 50 acts as a cathode and the large grounded chamber wall 55 acts as an anode. As discussed by Lii in "Etching", *ULSI Technology*, eds. Chang et al. (McGraw-Hill, 1996), pp. 330–333, the pedestal 50 develops a negative DC potential $V_a$ relative to the grounded wall 55 of magnitude given by $$\frac{V_c}{V_p} = 1 - \left(\frac{A_a}{A_c}\right)^4, \tag{1}$$

where $V_p$ is the plasma potential, typically on the order of a hundred volts positive or less, $A_a$ is the surface area of the chamber wall 55 adjacent to the plasma, and $A_c$ is the area of the top surface of the pedestal 50. In the common case of FIG. 1 with a small RF-powered cathode 52 and a large grounded anode 54, the area ratio is quite large and the cathode voltage $V_c$ is negative because the DC plasma voltage is always positive. Thus, the equation can be simplified to $$\frac{|V_c|}{V_p} \approx \left(\frac{A_a}{A_c}\right)^4, \tag{2}$$

It is thus seen that for large grounded chamber walls surrounding the plasma, the voltage $V_c$ on the pedestal 50 can reach several hundred negative volts relative to both the plasma and the chamber wall 50, creating a significant diode effect and causing positive ions in the plasma to strike the wafer on the pedestal 50 at high energy.

As wafer sizes have increased and demands for uniformity have intensified, the chamber geometry has changed to present a more planar geometry. See, for example, U.S. Pat. No. 4,892,753 to Wang et al. for a CVD chamber and U.S. Pat. No. 4,948,458 to Ogle for an etch chamber. As illustrated in FIG. 2, a counter electrode 58 is positioned opposite to the pedestal 52 and its supported wafer 50 across a gap that is substantially less than the diameter of the wafer 50. For example, the gap may be a few centimeters for a 200 mm wafer. The counter electrode 58 is typically grounded for etch applications while the RF powering configuration is usually reversed for CVD. Often the counter electrode 58 includes a shower head gas dispenser to uniformly supply reaction gas to the reaction zone adjacent to the wafer 50. In this design, the walls of the chamber 54, although usually grounded, assume less importance in the plasma and the chemical reactions.

Chapman discusses the sheath voltages for the symmetric configuration in *Glow Discharge Processes: Splittering and Plasma Etching* (Wiley-Interscience, 1980), pp. 156–171. He also gives a more general version of Equation (1) which does not assume a grounded cathode, $$\frac{V_p - V_1}{V_p - V_2} = \left(\frac{A_2}{A_1}\right)^4,$$

where $V_1$, and $A_1$, are the DC self-bias and the area of the first electrode and $V_2$ and $A_2$ are the corresponding values for the second electrode.

Ogle et al. in the U.S. Pat. No. 4,871,421 teaches the advantages of splitting RF power in a 50:50 ratio between the pedestal 52 and the counter electrode 58 with respect to the grounded chamber wall 54 so as to avoid arcing to the chamber walls. In the Ogle reference we observe vastly different sizes of the counter electrode and pedestal electrode, such as shown in FIG. 1. Such a difference in the electrode sizes creates the above described diode effect even for split RF power. Again, the differently sized electrodes cause high-energy charged ions to be ejected across the sheath of the plasma, causing increased physical sputtering (ion etching) rather than purely chemical activation.

Recent developments in plasma reaction chambers have been directed to high-density plasma (HDP) reactors in which large amounts of RF energy create a plasma having a very high ion density, typically above $10^{11} cm^{-3}$. HDP reaction chambers provide high deposition and etching rates as well as other advantages. There are several types of HDP reaction chambers, but the most popular involve induction coupling of RF energy into the source plasma. Inductively coupled plasma reaction chambers can be divided into three main types.

The first type, as illustrated in FIG. 3, includes a helical coil 60 wrapped around a dielectric sidewall 62, typically of quartz, and powered by an RF electrical source 64. The pedestal 52 continues to have its own RF source 56. For oxide etching, a counter electrode 66 is grounded and is composed of silicon in order to scavenge fluorine from the fluorocarbon plasma gas performing the etching. This approach is described generally by Collins et al. in U.S. Pat. No. 5,556,501 and European Patent Application 552,491.A1 and Rice et al. describe a specific embodiment in U.S. Pat. No. 5,477,975. Their specific embodiments will be described later in more detail in FIGS. 7 and 8. The configuration including a helical coil necessarily increases the size of the walls surrounding the sides of the plasma region. As a result, unlike in reactors with closely spaced capacitive electrodes, wall interactions become important both for forming the plasma and for the deposition or etching chemistry.

The second type of inductively coupled plasma reactor chambers, as illustrated in FIG. 4, includes a planar, spiral coil 70, often referred to as a pancake coil or stove top coil, placed outside a top, planar dielectric wall 72 to be close and parallel to the wafer 50. The pancake coil 70 is similarly powered by the RF source 64 to inductively couple power into the chamber plasma. For process control, the pedestal 52 may be RF biased. In the closely spaced configuration of FIG. 4, the chamber walls 74, which are typically conductive and grounded, are effectively decoupled from the plasma and its chemistry because of their physical displacement and small size relative to the closely spaced planar coil 70 and pedestal 52. Examples of the pancake coil are disclosed by Ogle in the aforecited patent and by Marks et al. in European Patent Application 601,468-A1.

The third type of inductively coupled plasma reactor chamber, as illustrated in FIG. 5, includes a hemispherical dielectric dome 80 positioned above the wafer 50. A concave spiral inductive coil 82 conformally following the shape of the doubly concave dome 80 is coupled to the RF power source 64. Its shape closely follows the shape of the hemispherical dome. As should be recognized, the hemispherical geometry of FIG. 5 is intermediate between the cylindrical geometry of FIG. 3 and the planar geometry of FIG. 4. Benzing et al. have disclosed the hemispherical coil in U.S. Pat. Nos. 5,346,578 and 5,405,480, and Sahin et al. have disclosed a similar but radially multi-curvature CVD reactor in European Patent Application 680,072-A2.

All these chamber geometries present respective advantages and disadvantages. It should be noted that the inductive coupling of these various embodiments relies upon the coils 60, 70, 82 driven by their respective RF sources to induce an RF magnetic field within a portion of the reaction chamber containing the excited plasma. The RF magnetic field induces an orthogonal electric field according to Faraday's law of induction $$\frac{\partial B}{\partial t} = -\nabla \times E. \quad (4)$$

As a result, the oscillating magnetic field, which generally lies at least partially along the axial chamber direction in the cases of the cylindrical and doubly concave domes, produces a rotary electric field within the plasma, that is, an electric field loop extending around the axial magnetic field and the electric field that closes on itself. This is alternatively called an azimuthal field since it has circular shape in a generally cylindrical geometry. The electrons circulating in the plasma along the rotary electric field lines collide with the plasma ions to keep the plasma in an excited state.

In free space, the solenoidal (cylindrical) coil 60 of FIG. 3 provides a uniform axial magnetic field that would be desirable for uniform etching or deposition on the relatively large wafer 50. However, the plasma created by the RF magnetic field effectively shields the inner portions of the plasma inside the cylindrical chamber 62, especially at higher chamber pressures. As a result, the plasma density for the cylindrical geometry of FIG. 3 tends to droop at the center. The planar pancake coil 70 of FIG. 4 potentially avoids this problem by inducing an RF magnetic field across the radius of the cylindrical chamber. While the pancake coil offers some advantages for planar uniformity, it also presents a difficult configuration for inductive coupling, since the magnetic field lines created by the pancake coil need to close on themselves, a disadvantageous electromagnetic configuration, especially near the center.

The third type of inductive coupling involving a curved-dome configuration illustrated in FIG. 5 combines advantages of the first two types. The hemispherical coil 82 of FIG. 5 attempts to combine the advantages of the other two approaches. The geometry resembles the electromagnetically favorable helical coil, but a substantial amount of power is coupled into the plasma above the central region of the wafer. Also, insofar as diffusion of species excited by the immediately adjacent coil 82 is important, all parts of the wafer 50 are generally equidistant from the coil 82. Sahin et al. in the previously cited application have suggested multiple radial curvatures for the dome that could be used to further improve the uniformity. However, the curvilinear dome of FIG. 5, while offering superior processing capability, presents several mechanical problems. A curvilinear dome is difficult to form whether by casting or machining. Further, the dome needs to be temperature controlled by heating and cooling elements in intimate contact within the dome. Unfortunately, differential thermal expansion between the dome and the thermal control elements tend to disrupt effective thermal contact between them over the two-dimensionally curved surface. Further, although a pure dome is mechanically strong, it is sometimes desirable to include a planar counter electrode at the top of a truncated dome, see Sahin et al. The resultant truncated curvilinear dome is structurally weak, and structural integrity is becoming increasingly important for a vacuum chamber of larger size necessary to enclose 200 mm and 300 mm wafers.

Collins et al. in U.S. patent application, Ser. No. 08/648, 254, filed May 13, 1996 have suggested using a conical spiral coil, but the base of the cone is placed adjacent to a flat roof of the chamber, with the result that a large portion of the spiral coil is displaced far away from the chamber, thus decreasing RF coupling into the plasma.

The portions of an inductively coupled plasma chamber adjacent to the inductive coil are in the prior art typically made of quartz. Although a metal (electrically conductive) wall would generally pass the magnetic field that the coil couples into the chamber, the circulating RF currents dictated by Equation (4) would be set up in the metal wall as well as in the plasma. Hence, the chamber wall is generally formed of a dielectric (electrically insulating) material.

Quartz has always been favored for walls of a plasma reactor, especially for semiconductor processing equipment. Quartz can be made in very pure form. Its chemical composition is essentially silica ($SiO_2$), which is usually compatible with silicon processing. Other commonly available ceramics, i.e., alumina ($Al_2O_3$) or sintered silicon carbide (SiC), commonly contain elements having uncertain effects on silicon chemistry and semiconducting characteristics.

Quartz however presents problems in advanced plasma reactors, especially oxide etchers for the semiconductor industry. Oxide etchers must etch the insulating layers of the substrate being processed, particularly layers of $SiO_2$. As a result, the very chemistry that effectively etches the wafer being processed can also effectively etch the quartz wall. Furthermore, quartz tends to be a dirty material when it is etched since it is formed of small crystallites joined in a matrix. When quartz is etched, the etching tends to accelerate in localized areas between the crystallites so as to undercut the unetched crystallites, which are then liberated from the matrix and become particulates, which can eventually settle on the wafer. Particle contamination is an increasing problem as the feature sizes of integrated circuits shrink and the number of circuit elements increases.

The etching of advanced integrated circuits, particularly oxide etching, has many severe requirements. Vias and contacts etched through oxide layers need to be narrow and deep, having aspect ratios of over 1:1 and sometimes 5:1 and greater. Etching is required that is highly anisotropic and very highly selective for silica over silicon. The thin layers require that the etching be highly selective to the underlying silicon so that the etching stops once the oxide layer has been etched through. The increased size of wafers has intensified the problem of uniformity of etching over the wafer.

Collins et al. disclose in the previously cited European application that the desired selectivity can be achieved by using a fluorocarbon etching gas, such as $CF_4$, $C_2F_6$, or $C_3F_8$ or a hydrofluorocarbon such as $CHF_3$ in combination with a silicon-containing counter electrode placed over the wafer in order to scavenge fluorine from the fluorocarbon plasma. This process deposits a polymer over silicon but does not deposit it over silicon dioxide, thus protecting the silicon from etching once it is exposed. A similar differential polymer deposition on the walls of a via through silica produces nearly vertical sidewalls. As postulated by Rice in U.S. Pat. No. 5,477,975 and in U.S. patent application Ser. No. 08/524,135, filed Sep. 5, 1995, that process includes a dependency upon temperature, not only of the wafer, but also of the silicon counter electrode and of other chamber components among other process factors which may be involved.

Reaction rates generally vary as a power of the temperature, usually in the range of $T^2$ to $T^3$, and, in the spatially differential reaction process of selective etching, variations in temperature can drive the process between etching and depositing upon the various parts. For example, a start-up effect has been observed when a chamber is first turned on, say at the beginning of the day or after routine maintenance. Curve 90 in FIG. 6 shows the etching rate for silicon dioxide and curve 92 shows the corresponding etching rate for photoresist, both as a function of the number of wafers processed after the start of processing. The oxide etching rate increases with wafer number while the photoresist etching rate falls. Only after about 25 wafers have been processed do the rates approach steady-state values. It is believed that the variations reflect the rise of temperature of components within the chamber interior caused by the plasma processing. The effect can be circumvented by using dummy wafers for the first run of the day, but this significantly reduces throughput. Also, lesser temperature variations can occur when the processing is interrupted for minor equipment failures or because wafers are not immediately available. Hence, the temperature of many parts of the chamber need to be tightly controlled. Some past designs have attempted to control wall and component temperatures, but these designs need to be improved.

Furthermore, quartz presents a fundamental materials problem. It is a ceramic with poor thermal conductivity, typically in the range of 0.5 W/m-° C. Even if a temperature control body (heater/cooler) is applied to the exterior of the quartz chamber wall, the temperature of the wall side facing the reaction chamber may still be poorly controlled. This problem is exacerbated by the configuration of the cylindrical design of FIG. 3. A detailed embodiment of this configuration is illustrated in the cross-sectional view of FIG. 7 and the detailed cross-sectional view of FIG. 8. A cylindrical chamber wall 100 is surrounded by a cylindrical temperature control jacket 102, in this case accommodating an solenoidal RF coil 104. The cylindrical chamber wall 100 rests on a lower chamber 106, generally a massive body machined from aluminum, and the upper part of the cylindrical chamber wall 100 supports a roof 108, which for oxide etching is preferably in the prior art composed of polysilicon. An RF connector 110 supplies RF power to the roof 108. A heater plate 112 is pressed against the top of the roof 108 and contains a spiral resistive heater powered through two electrical connectors 114, 116. A chilling assembly is pressed against the top of the heater plate 112 and includes a chilling plate 118 having at least one spiral groove 120 formed in it for a cooling fluid, such as chilled water. A cover plate 122 covers and seals the groove 120.

Referring to FIG. 8, an annular resistive heater 122 is embedded in a groove 124 at the bottom of the jacket 102 to selectively heat the jacket 102 and hence the chamber wall 100, particularly when the RF coil 104 is not energized.

An assembly gap 126 is formed between the chamber wall 100 and the thermal jacket 102 when the two are put together. The assembly gap 126 is required for two reasons, the need to slide the parts together during assembly and the inevitable differential thermal expansion between the two parts 100, 102. If the assembly gap 126 were absent, assembly would require complex procedures, and the parts, once assembled, would tend to crush each other under a sufficient difference in temperature. The assembly gap 126 creates a region across which thermal energy is poorly transferred, when compared with heat conduction in a conductive material. The rate of heat transfer is dependent on the size of the gap 126 and the pressure of the gas within the gap 126. That is, thermal expansion create variations in the gap and the resulting heat transfer rate across the gap. Further, the gap between cylindrical components is generally not equally distributed around the cylindrical shape because of inevitable asymmetries, but is smaller on one side than on the other side. The variation in the gap causes a variation in the rate of heat transfer between the cylindrical bodies depending on size of the adjacent gap. Thus, the rate of heat transfer at different locations around the wall differs depending on the size of the adjacent gap. Furthermore, the cylindrical chamber wall has typically been made of quartz, a poor thermal conductor. These variations render the use of conventional modes of temperature control in this configuration less effective than desired when precise temperature control in a small range of temperature is required.

The cylindrical chamber of FIG. 7 results in the general geometry of FIG. 9 of a cylindrical sidewall 124 and a top 126 of generally the same diameter. The diameter of a wafer area 128 is necessarily smaller than that of the chamber sidewall 124 and its top 126. The cylindrical sidewall 124 is good for supporting the vacuum-loaded weight of the top 126, but, as the top 126 extends over larger spans for large substrates, such as 300 mm wafers, it is prone to bend inwardly unless made excessively thick.

In the past, when chamber components have been replaced, in addition to the cold-start phenomenon, additional wafer cycling has been required to return the process to its baseline process performance. It is assumed that the new parts require some conditioning to achieve their final effect. Temperature instability due to the use of new components having new component interfaces is at least partially to blame for the need for additional thermal cycling to eliminate process drift and return the process to a baseline performance standard.

SUMMARY OF THE INVENTION

The invention is a plasma reaction chamber particularly suited for fabrication of semiconductor integrated circuits and especially so for oxide etching. The chamber includes several related inventions among which is a chamber wall in the form of a truncated conically shaped dome positioned over and around the wafer. The outside cone surface of the chamber wall in one embodiment mates with an inside sloped surface of a surrounding thermal control ring. The thermal ring rests on the outside of the conical chamber wall and can be configured to be urged against it to provide a sliding thermal interface between them. In this configuration, differential thermal expansion between the wall and the thermal ring causes sliding along the conical angle of the interface surface, to thereby maintain the thermal contact regardless of temperature or expansion differentials. A conically arranged RF induction coil can be wrapped around the conical wall surface, or a flat or solenoidal RF coil can be wrapped on the top of the chamber. Either placement can be used to produce electrical fields in the chamber to induce a plasma, and the fields can be tailored to extend over the center portion of the wafer, thus improving plasma processing uniformity.

The roof of the chamber in such a configuration can be a dielectric, or can be a material which acts as a conductor or semiconductor which provides a flat surface to act as an electrode in a capacitive coupling arrangement, the pedestal being the other plate through which capacitive coupling is accomplished. Advantageously for dielectric etching, the roof can be made of a carbon- or silicon-containing material.

The resistivity of the material of the chamber wall can be adjusted to permit effective penetration of electrical fields through the material (e.g., polysilicon or silicon carbide) to effective induce a plasma in the processing chamber.

The thermal ring can contain heating, cooling, or electrical field inducing elements. These elements can be present singly or in any of the available combinations. Fine temperature control of several elements allows better process control and uniformity. in one configuration, the heating element for the chamber wall is adjacent to the outer conical wall of the chamber. The wiring of the heater element being in a serpentine pattern, the element being arranged in primarily an up and down pattern following along a set of lines which would pass from the apex of an untruncated cone to the base of the cone, referred to as being generally vertical. The inductive coil to create the RF magnetic and hence the electrical field that induces the plasma in the chamber is wrapped horizontally around the heater element, the coil conductors thereby being in a direction that is substantially perpendicular to the direction of the predominant routing of the wires of the heating element in the heater. The perpendicularly crossing wires create a Faraday shield to shield the chamber from capacitive effects of the inductive coil, while allowing the electrical field to be efficiently induced in the plasma. In a layered construction the induction coil is located between the heating element on the inside and a cooling element on the outside. A thermally conductive dielectric member supports the induction coil and facilitates heat transfer to increase or decrease the temperature of the wall of the chamber inside the thermal ring. The progressive layers of the heater element, the induction coil, and the cooling element can be in separate structures or can be sandwiched together in one bonded structure.

The conical geometry allows the aforedescribed heater element to be fabricated in a planar flat flexible sheet, which is then conformally wrapped around the conical surface.

When using a conically shaped chamber wall wrapped in a conically shaped windings of an induction coil, the top winding of the coil is closer to the center of the chamber than in a cylindrically shaped coil. The proximity of the top windings to the center of the chamber improves the uniformity of deposition across the chamber and tends to eliminate the reduction in field strength found at the center of chambers where only a peripheral induction coil is used.

A chamber wall according to the invention exhibits reduced temperature variation in the wall of the processing chamber, to eliminate undesirable effects which in the past have tended to have a detrimental effect on process repeatability.

A chamber according to the invention includes a chamber wall having a conical outer wall surface with a conically shaped induction coil. In the conical portion of the chamber is a frustum of a right circular cone and a top edge of the frustum of said right circular cone is spanned by a counter electrode having an area approximately equal to the surface area of a substrate face facing the counter electrode and located approximately opposite to it. The helical shaped wire coils can be centered on the substrate processing location. The roof member can be integral with the conical portion of the wall. Useful materials for the wall and roof structure have good heat transfer properties, dielectric properties, and chemical resistance to the process chamber environment. Acceptable materials include polysilicon, and silicon carbide.

The conical coil windings progressively expand and can have an approximately constant pitch or can have a variable pitch. A flat pancake type coil can be provided on the roof of the chamber or a vertical cylindrical (solenoid like) coil can be provided. The roof coil enhances the uniformity of the electric field induced in the chamber. The conical winding adjacent to the process chamber wall can be placed in parallel or in series with the coil located on the roof of the chamber. A conical coil can be easily wrapped on a winding jig having a spiral conical incline. A coil power adjustment circuit can be provided to set the effect of each of these coils.

The invention may include a thermal heater in intimate thermal contact with the outside wall surface, the pattern formed by a heating element of said thermal heater is a serpentine path, preferably having a series of longitudinal element sections routed approximately parallel to one another and each being approximately coincident with one of a series of planes containing both the central vertical axis of the heater and one longitudinal element. The central body of the heater each longitudinal section is connected to an adjacent longitudinal section through alternating patterns of top and bottom lateral stub connections, wherein said longitudinal sections of said heater element are substantially longer than said lateral stub connections. The induction coil in this configuration is disposed proximate to the outside surface of the sidewall and outside of the thermal heater, such that the windings of the coil are routed around said central vertical axis of the vacuum processing chamber and generally parallel to the direction of the lateral stub connections and perpendicular to the longitudinal sections of the heating element. The side wall and or the induction coil can be vertically shaped or can be conically shaped. The sidewall being constructed of a silicon compound having a bulk thermal conductivity greater than a similarly configured sidewall constructed of silicon dioxide (quartz) or silicon nitride, e.g., polysilicon or silicon carbide.

In one configuration, the induction coil can be housed in a thermally conductive dielectric member having a conically shaped inside surface configured to provide surface contact for heat transfer between the outer wall surface of the wall of the chamber and the inside surface of the dielectric member. A sliding movement between the outer wall surface of the chamber wall and the inside conical surface of the dielectric member accommodates motion due to changes and differences in temperatures between the chamber wall and the dielectric member. The dielectric element can include a heating element to heat said member and said side wall, the heating element can be located inside or outside the induction coil. The heating element can be embedded in an outer cone shaped ring portion of said dielectric member, which is fixed to an inside cone shaped ring member through a thermally transmissive connection. A cooling ring can be attached to an outside surface of the dielectric element to be in thermal contact with said dielectric member, the cooling ring has a cooling fluid passage therethrough to pass thermal transfer fluid. The cooling ring can be disposed adjacent to one end of the sidewall.

A method of controlling the temperature according to the invention includes the steps of providing a sidewall of said vacuum processing chamber with a conical outer surface and providing a conical inner surface on a thermal source ring to mate in a sliding engagement with the outer conical surface of the chamber wall. Additional steps may include locating a heating member in thermal contact with a second side of said sidewall, having a primary orientation of a heater element pattern routed in a back and forth pattern with a substantial portion of said pattern of said heater element running approximately parallel to one another, and the further step of providing an induction coil in a configuration to surround the chamber wall and the heating member, the wire of the induction coil windings being configured to run approximately perpendicular to the portion of the heater element running approximately parallel to one another. The method may include the further step of providing a cooling ling disposed adjacent to one end of the sidewall. A connection between the sidewall and the cooling ring being established to provide thermal and electrical conductivity between them.

A method of maintaining the temperature of the sidewall of the processing chamber includes the steps of: providing a chamber side wall; providing an induction coil around the sidewall, the wire of the coil wrapped around and being configured perpendicular to a central axis of the chamber; and providing a heater element between the coil and the sidewall, the heater clement having a pattern where a substantial portion of the element runs approximately parallel to the central axis of the chamber and perpendicular to the wire in the coil.

A method according to invention further involves the steps of providing a source of thermal energy to a thermally conductive sidewall of a chamber, simultaneously providing a heat sink connected to the sidewall of the chamber and varying the supply of thermal energy and the sinking of thermal energy to control the temperature of the sidewall at approximately a set temperature. The method includes the further step of simultaneously providing an induced electrical field through the wall of the chamber, to cause gas in the processing chamber to form a plasma. The heating of the sidewall can be through a flexible heater placed in intimate contact with the sidewall and cooling can be done through a cooling ring located in one of several locations—at the bottom end of the sidewall, behind the heating element, at the top end of the sidewall, or at both the top and bottom ends of the sidewall, or any other similar combination of cooling ring locations.

Structures and methods according to the invention provide a more precise temperature control in the chamber which enhances process repeatability by using a geometric configuration of materials which are easy to manufacture and perform well in the process environment. The selection of materials provides options for variations in resistivity while maintaining the thermal performance needed to establish and repeat the thermal aspects of process parameters to a range of between plus and minus 5 and 20 degrees Celsius.

BRIEF DESCRIPTION OF THE DRAWINGS

FIG. 1 is schematic side view of a capacitively coupled plasma reaction chamber of the prior art having a large ratio between the area of the substrate and the area of the counter electrode.

FIG. 2 is a schematic side view of a capacitively coupled plasma reaction chamber of the prior art having the substrate and counter electrode being closely spaced.

FIG. 3 is a schematic side view of a plasma reaction chamber of the prior art that is both capacitively and inductively coupled.

FIG. 4 is a schematic side view of a plasma reaction chamber of the prior art having an planar inductive coil positioned over the wafer.

FIG. 5 is a schematic side view of a plasma reaction chamber of the prior art including a hemispherical inductive coil positioned generally above the wafer.

FIG. 6 is a graph showing etching selectivity as a function of wafer or time after a cold start.

FIG. 7 is a cross-sectional view of a prior art processing chamber.

FIG. 8 is a closeup view of a sidewall of the processing chamber of FIG. 7.

FIG. 9 is a perspective schematic view of the relative size of an upper counter electrode and a wafer support pedestal electrode present in the prior art processing chamber of FIG. 7.

FIG. 10 is a cross-sectional view of a processing chamber according to the invention.

FIG. 11 is an exploded perspective view, partly in section, of the components of the chamber illustrated in FIGS. 10 and 12.

FIG. 12 is an enlarged cross-sectional view of the embodiment of a conical sidewall of the processing chamber as shown in FIGS. 10 and 11, the ring heating/cooling member being a somewhat different shape.

FIG. 13 is an enlarged cross-sectional view of a portion of FIG. 10 showing the center gas feed and thermocouple.

FIG. 14 is a perspective schematic view of the relative size of an upper counter electrode and a wafer support pedestal electrode present in a processing chamber according to the invention as shown in FIG. 10.

FIG. 15 is a schematic side view of the processing chamber components as shown in FIGS. 10–12 illustrating the forces and movements generated during thermal cycling.

FIG. 16 is a graph of the plasma uniformity both in the prior art and with the reactor of the invention.

FIG. 17 is a closeup cross-sectional view of another embodiment of a processing chamber showing a lamp heated sidewall arrangement for the chamber as shown in FIG. 10.

FIG. 18 is a still another embodiment of a flexible element heater configuration for the processing chamber as shown in FIG. 10.

FIG. 19 is a partial side view of the heater elements and surrounding coil structure as pictured in the cross-section of FIG. 18, viewing at the direction 19, the heater sheath not being shown.

FIG. 20 is a side perspective exploded view, partly in section, of the components of the chamber stricture as pictured in the cross-section of FIG. 18.

FIG. 21 is a side perspective cross-sectional of an alternative configuration for the windings of the wire coil of FIG. 20.

FIG. 22 is a plan view of a conical heating sheath cut from a planar sheet.

FIG. 23 is a side view of a winding jig for winding the wire of the induction coil in a conical shape according to the invention.

FIG. 24 is a cross-sectional view of another embodiment of the top portion of the processing chamber according to the invention showing secondary coils and secondary heater/coolers on the upper portion of the roof of the chamber.

FIG. 25 shows the conceptualized flow of thermal energy through the sidewalls for the prior art processing chamber as shown in FIG. 7.

FIG. 26 shows the conceptualized flow of thermal energy through the sidewalls for the processing chamber according to the invention as shown in FIG. 10.

FIG. 27 shows the conceptualized flow of thermal energy through the sidewalls for the processing chamber according to the invention as shown in FIGS. 18, 19, and 20.

FIG. 28 shows the conceptualized flow of thermal energy through the sidewalls for the processing chamber according to the invention as shown in FIG. 24.

FIG. 29 is a schematic diagram of a preferred functional configuration incorporating features of the invention.

FIG. 30 is a schematic diagram of a power splitting arrangement supplying and splitting power between a roof electrode opposite the substrate being processed and a susceptor supporting the substrate being processed according to the invention.

FIG. 31 is a block and connection diagram for a controller for implementing the invention.

FIG. 32 is a schematical cross-sectional view of a plasma reactor chamber with separate roof and conical dome and using both a primary and a second coil for inductively coupling energy into the chamber.

FIG. 33 is a schematical cross-section view of a plasma reactor chamber having a conical dome but with standard biasing only of the pedestal.

FIG. 34 is a schematical cross-sectional view of a plasma reactor chamber having a grounded conical dome and RF power splitting between the roof and pedestal.

FIG. 35 is a schematic cross-sectional view of a plasma reactor chamber electrically configurable to operate in a number of processing modes.

DETAILED DESCRIPTION OF THE PREFERRED EMBODIMENTS

Several configurations according to the invention include common features which assist both in inductively coupling RF energy into the plasma within the chamber and in controlling the temperature of the wall of the processing chamber by providing both heating and cooling via a thermal ring surrounding the wall of the processing chamber. A conical configuration of the wall assures good thermal contact and eliminates the air gaps present in prior art designs. The use of specially chosen materials improves process chamber performance, by permitting the penetration of electric fields to induce the gas in the processing chamber into a plasma while providing good thermal conductivity to nearly eliminate process variations due to temperature gradients in the wall of the processing chamber. The use of a conical wall shape together with conically shaped induction coil windings reduces the variation in the electric field in the chamber (particularly at the center of the chamber), while the use of fixed and variable pitch coil windings can fine tune the effect of the desired electric field. Potential electrical interference between the heater element surrounding the chamber and the inductive coil surrounding the chamber is for the most part eliminated by routing the wiring of the coil in a direction which is predominantly perpendicular to the routing of the heater element. The chamber configuration provides a process location where approximately equally sized electrodes (the roof and the pedestal) are configured parallel to one another in a one-piece multi-purpose chamber configuration. The cone shaped upper chamber configuration can be made of one piece and can be capacitively coupled as well as inductively coupled.

FIGS. 10, 11, and 12 show respectively the cross-sectional, exploded schematic perspective, and close-up cross-sectional views of a top portion of an embodiment of an etch processing chamber according to the invention.

An upper sidewall portion of the chamber includes a conical dome 130 extending from the side of the lower chamber 106 to a position approximately over the edge of the pedestal 52 supporting the wafer to be processed. The conical dome 130 has a sidewall that has at least an outer surface that is conically shaped, that is, is circularly symmetric about a central axis and slopes at a fixed angled to the central axis. The conical dome 130 is arranged to have a larger rim at its bottom side towards the wafer processing area and a smaller rim at its top side away from the wafer processing area. The conical dome 130 has a sidewall with a conically shaped inner surface and a conically shaped outer surface although it may have other surface portions besides the inner and outer surfaces. That is, the inner and outer surfaces are circularly symmetric about a central vertical axis of the chamber, and their diameters change linearly along that axis. Particularly, the outer conical surface provides several useful advantages.

A plasma shield 132 at the bottom of the conically shaped dome 130, as best shown in FIG. 11, is preferably made of quartz or silicon carbide and has an "L" shaped cross section. A bottom leg 134 of its "L" shaped cross section is supported on the upper flange opening of the lower processing chamber 106, which is usually made of aluminum. An unillustrated O-ring seals the plasma shield 132 to the lower chamber 106.

A top cylindrical leg 136 of the "L" shaped cross section of the plasma shield 132 extends vertically upwards inside the chamber to act as a barrier (shield) in front of a bottom seal ring 138 fitting circumferentially around the radial outside of the shield's vertical leg 136. The bottom seal ring 138, which is preferably made of a metal such as aluminum, is supported on and sealed to the top of the horizontal, lower leg 134 of the plasma shield 132.

The bottom seal ring 138 includes, as best shown in FIG. 12, an inwardly extending lip 140, against which is pressed a bottom O-ring 142 located outside of the seal ring 138 and adjacent to an annular bottom resilient support pad 144, both of which are located in a downwardly facing sealing channel 146 at the bottom of the lip 140. The O-ring 142 seals the bottom of the seal ring 138 to the top of the plasma shield 132 of FIG. 11, while the bottom resilient support pad 144, made of a high-temperature plastic, for example, of polyimide sheets such as of Vespel or Kapton, supports and distributes the load of the seal ring 138 and the portion of the chamber above the seal ring approximately evenly to the plasma shield 132, which is typically made of a brittle material such as quartz. This arrangement avoids point loads between the pieces which cause stress concentrations and can cause the plasma shield to fracture. A lower sealing channel retaining lip 148 on the radially inward end of the seal ring 138 prevents the lower resilient pad 142 and the adjacent O-ring 142 from sliding radially inwards within the downwardly facing sealing channel 146. The inwardly extending lip 140 includes on its upper side an upwardly facing channel 150 containing an upper O-ring 152 and another annular resilient heat conducting pad 154. An upper retaining lip 156 extending upwardly from the lower retaining lip 140 prevents the upper heat conducting pad 154 and the upper O-ring 152 from sliding inwardly. The upper resilient heat conducting pad 154 is preferably made of a high-temperature plastic such as Vespel, but other materials may be used dependent upon the reactor temperature and its corrosive environment.

The upper resilient pad 154 supports a bottom edge 158 of the conically shaped chamber sidewall (dome) 130, whose inside surface faces a substrate processing location 152 (FIG. 10) in the processing chamber. The conically shaped sidewall (dome) 130 is made of material having a generally high electrical resistivity but very good thermal conduction qualities, specifically having a thermal conductivity greater than that of quartz or silicon nitride. These generally conflicting characteristics can be satisfied by a silicon-based material such as polysilicon, which is unfortunately subject to brittle fracture and generation of micro particles. Below, however, is described a silicon carbide composite, which has many advantages for these applications.

The upper resilient heat conducting pad 154 assists in distributing the mechanical load, due to the weight of the pieces and the vacuum inside the chamber, imposed by the dome 130 on the seal ring 138 to prevent fracturing due to point loads, just as was discussed above for the plasma shield 132.

The seal ring 138 also includes an outside wall flange 160 extending vertically upwards from the lip 140 and having an inside groove 162 of the O-ring type enclosing an electrically conductive elastic (spring) member 166, which is preferably a hollow spring member in the shape of an O-ring. It can be formed by tightly winding a metal ribbon in a spiral so that the outside of the spiral forms a generally circular cylinder with a hollow core so as to form a tube. The wraps of the spiral need not touch, thereby producing a non-continuous tube. The ends of the resulting tubular member are joined or brought into close contact with one another to form a ring. From the outside, the spring member 166 tends to look like an O-ring with some spiral edges, grooves, or openings. A side surface of the spring member 166 protrudes beyond the mouth of the inside groove 162 and acts as a compliant set of continuous spring contacts to maintain electrical continuity across a gap 168 between the dome 130 and the seal ring 138. The elastic (compressive) range of such a spring member 166 effectively accommodates variations in the size of that gap 168 with a bottom outside edge 170 of the dome 130 while continuing to assure electrical contact with it. The SiC composite dome 130 of Lu et al., to be described later, includes an insulative body and a conductive surface layer facing the plasma. The surface layer continues around the bottom of the dome 130 into an annular tab surrounding the outside of the lower rim. The spring member 166 is positioned to electrically contact the annular tab so as to ground the inner surface of the conical dome 130.

In some configurations, the seal ring 138 will extend further radially outwards, as shown by the dashed lines 172. The extended seal ring 172 provides space for an annular cooling passage 174 and a closure plate 176 sealed to the extended seal ring 172 to contain a thermal transfer fluid circulating in the cooling passage 172 to heat and/or cool the perimeter of the seal ring 138. A pump 173 under the control of an automated controller selectively supplies cooling fluid, e.g. water, to the cooling passage 174.

The upper resilient thermal pad 154 located between the conical dome 130 and the seal ring 138 provides a thermally conductive bridge between the bottom end 158 of the conical dome 130 and the lower seal ring 138 so that thermal energy heat freely conducts across the joint between the dome 130 and the bottom seal ring 138. This eliminates the disadvantage of the variability of the conduction of thermal energy across air gaps where the effective thermal conductivity can vary due to changes in the contact area of surrounding surfaces and actual gap size as well as with the pressure of gas in the gap. The upper resilient thermal pad 154 provides a continuous conductive path with predictable qualities having a repeatable thermally transmissive behavior. It improves the temperature control of the chamber dome sidewall 130, and it has been demonstrated to reduce the temperature gradient to less than 5° C. with 2000 W of RF power input to the inductive coil.

The conical sidewall 130 may have a uniform thickness from bottom to top, or as shown in the figures, can be tapered with a bottom thickness dimension 172 being thicker than an upper thickness dimension 174. Stress analysis of the dome 130 when a vacuum is applied to its interior shows that the taper to a narrow thickness at the top equalizes the stresses in the upper part of the dome 130 with those in the lower part. Therefore, the upper part can be made thinner while maintaining an approximately uniform stress distribution in the dome material. The allowable stress in the dome material and therefore its thickness is set by the particular material chosen and the temperature to which the material is likely to be heated during processing of substrates. When the dome is made of a polysilicon material it needs to be thicker than if the dome 130 is made of a silicon carbide material. For other materials, the material properties at temperature need to be taken into account to select the minimum usable thickness. For a polysilicon dome 130 having a bottom diameter of approximately 15 inches (380 mm) and a height of approximately 2¼ inches (57 mm) the wall thickness at the top is approximately ⅜ inches (9.5 mm) while the wall thickness at the base of the cone is approximately ⅝ inches (15.9 mm). For a silicon carbide dome, the respective thicknesses are each reduced to achieve a similar ratio of 5:3 to provide an approximately similar relationship between the maximum localized stress and the yield strength of the material as has been described for a polysilicon dome.

The inside and outside of the conically shaped sidewall 130 are easily manufactured by machining straight cuts along the inside and outside dome angles when the dome blank is on a lathe spindle or other spinning base. This ease of manufacturability is in contrast to the complex shapes and tooling required to make a partially rounded or hemispherically shaped dome.

Silicon carbide has been suggested as a material for chambers and components within them. It has a coefficient of thermal conduction of greater than 150 W/m·° C., which is substantially greater than that of quartz. Improving the temperature stability of exposed walls of the processing chamber is accomplished by providing a wall material which is a dielectric, acts as a window to allow penetration of electrical fields, provides good thermal conductivity, and is chemically compatible with the chamber environment during deposition and etching steps of the process. Also the geometric configuration of the outside wall of the processing chamber has a conical shape, which provides superior surface contact and temperature control between the wall of the chamber and a surrounding thermal control member, when compared to the thermal characteristics associated with a vertical right angle walled chamber.

Silicon carbide has been suggested as a substitute for elemental silicon to act as a fluorine scavenger. However, heretofore, components of silicon carbide have been mostly available in sintered form, which suffers many of the particle problems of quartz. However, recently Lu et al. have disclosed in U.S. patent application, Ser. No. 08/687,740, filed Jul. 26, 1996 a composite structure including both a bulk member formed and shaped of sintered silicon carbide and a relatively thin layer of silicon carbide deposited on the plasma-facing side of the member by chemical vapor deposition (CVD). The bulk structure can be easily formed into nearly arbitrary shape by standard sintering processes and provides superior strength and acceptable thermal conductivity. The CVD surface layer is highly resistant to plasma etching and is not prone to producing particles.

Furthermore, electrical conductivity of the surface layer can be controlled separately from that of the bulk silicon carbide, which enables the composite to have an effective skin depth small enough to admit electromagnetic radiation while simultaneously being able to be electrically grounded, if desired.

When a conically shaped induction coil 180 is placed in proximity to the outside of the conically shaped sidewall 130, the resulting geometry provides nearly the same beneficial effect upon the plasma as a hemispherically shaped coil placed over a hemispherical dome since it produces nearly the same electrical and magnetic fields which are known to improve the uniformity of the plasma density in the gas in the chamber. The plasma uniformity is critical for spatial uniformity of etching or deposition. The presence of an upper winding of the coil 180 closer to the center of the chamber reduces the variation in plasma density across a substrate (wafer) being processed. It is seen by superimposing a cross section of a conically shaped coil, for example coil 180 in FIG. 10, over a similarly sized hemispherically shaped coil, that the displacement between corresponding windings is small. When comparing a purely conically shaped sidewall with a purely hemispherically shaped sidewall having closely proximately surrounding induction coils, the hemispherically shaped chamber top provides a more uniform plasma density, but the uniform stress distribution means that neither untruncated chamber has an advantage over the other in strength.

However, many processes require that a flat electrode (counter electrode) be placed opposite to the processing surface of the substrate to provide a favorable bias for the process. Such a counter electrode requires that the roof of the chamber be approximately flat or that penetrations be made in the sidewall and/or roof of the chamber to support and electrically connect to the counter electrode located opposite the pedestal 52. In these instances when the top of the hemispherical roof is truncated or flattened, the stress at the truncated edge of the hemisphere (or radiused dome) increases such that a severe discontinuity is created in the stress distribution because of the outwardly curving walls. On the other hand, when a cone is truncated into the conical geometry shown in FIG. 14 no such discontinuity is created because the straight sided walls 182 of the dome are in line with the applied load and carry the vertical load in compression without a severe discontinuity at the top edge of the frustum, that is, the top edge 184 of the shell of the truncated cone. The advantage of a frustum shape for the dome 130 is that the stress distribution pattern is not distorted due to the straight sidewall 182, and through a middle range of the conical shape, the coil windings on the outside of the sidewall 182 produce an ion distribution (plasma density) which closely approximates that produced by coil shaped around a hemispherical dome. The truncated conical dome has been calculated to a seven times stronger than a similarly sized truncated hemispherical dome.

Returning to FIGS. 11 and 12, the outside surface 186 of the conically shaped sidewall 130 is cut at a set inclination angle which supports an annular induction coil support member 188 having an inside conical surface 190 whose inclination angle is matched to that of the sidewall's outside surface 186 so that the two surfaces 186, 190 fully contact each other over an area proximate to the outside surface 190 of the coil support member 188. The inclination angle α is defined, as illustrated in FIG. 15, as the acute angle between an inclined straight line on the conical surface 192, common to conical surfaces 186, 190, and a base plane 194 perpendicular to the axis 196 of symmetry of the conical surface 192. A related apex angle β is defined as the full angle of the apex 198 of the cone. For conically shaped members 130, 188 made of silicon carbide, polysilicon, or aluminum nitride and having a surface finish of 32RMS, an apex angle β of approximately 105° is satisfactory. The selection of the inclination angle α for various material properties and surface finishes can vary. However, in each instance the inclination angle must not equal or exceed the crush angle of the adjacent components.

The crush angle is defined as the angle at which the surface finish, coefficient of friction, and normal force will cause two components mated on a conical surface to lockup irrespective of the force when the inner component expands or the outer component contracts, or in more precise terms when there is relatively larger expansion of the inner member or relatively larger contraction of the outer member, as may occur with differential thermal expansion of the two members. Two components become locked at the angled conical interface when the force applied along the interfacial surfaces to cause the parts to slide relative to each other is insufficient to overcome the frictional force resisting sliding between the two components. When the components are locked, further expansion (contraction) causes elastic crushing of the interface surfaces in contact with each other, that is, interference stress. Two components can be locked together under conditions under which relatively low values of force along the interfacial surfaces are insufficient to break the static frictional force keeping them together, but higher force values will break the lock. However, in a lockup situation, no matter how great a force is applied to initiate sliding, geometric factors prevent the force tending to cause sliding from overcoming the functional force. The interference stress may rise to the point that one or the other of the components fractures.

As illustrated on the right side of FIG. 15, when the two members 130, 188 become engaged because of thermal expansion or contraction, the disparity in sizes (interference) is up to a point elastically accommodated within the members 130, 188. The elastic compression imposes a radial thermally driven force FT between the members 130, 188 one against the other in opposite directions. This discussion will address only the freestanding coil support member 188. The radial force $F_T$ can be decomposed into components $F_N$, $F_P$ respectively normal and parallel to the conical surface 192 whose magnitudes are related to the inclination angle α by $$F_N = F_T \sin\alpha \tag{5}$$

and by $$F_P = F_T \cos\alpha. \tag{6}$$

Other biasing forces such as weight and springs are not included in these equations but could be easily added.

If expansion or contraction biases the coil support 188 against the dome 130, the force of static friction prevents the coil support 188 from moving along the direction of $F_P$ until $F_P$ exceeds a threshold value $F_{TH}$. In the usual approximation, the threshold frictional force $F_{TH}$ is related to the normal force $F_N$ by the linear relation $$F_{TH} = c_{ST} F_N, \tag{7}$$

where $c_{ST}$ is the coefficient of static friction and is assumed to be approximately constant for a given pair of materials and associated surface finishes. Algebraic manipulation of these equations produces the result that $$\frac{F_{TH}}{F_P} = c_{ST} \tan\alpha. \tag{8}$$

This last equation implies that for a sufficiently large coefficient of static friction $c_{ST}$ and for a sufficiently large inclination angle α, specifically, when the product on the right side of Equation (8) is greater than one, the frictional threshold force $F_{TH}$ is always greater than the force attempting to break the static frictional lock and cause the members to slide. As a result, the thermally driven force $F_T$ can increase until the yield or fracture limit of one or the other of the members 130, 188 is exceeded and the member 130, 188 permanently deforms or breaks. On the other hand, if the product on the right side in Equation (8) is less than one, when FP increases to a value exceeding the frictional threshold $F_{TH}$, the force of static friction resisting movement is overcome, the static frictional lock is broken, the smaller dynamic coefficient of friction applies, and the coil support 188 can move upwardly to a position, still in contact with the dome 130, at which both members 130, 188 are no longer in compression.

Thus, if the inclination angle is α greater than the crush angle, functional lockup occurs and the locked parts are subject to mechanical damage; however, when the inclination angle is less than the crush angle, the lockup between components at the angled surface does not occur during such expansion or contraction, but the components only slide relative to each other, and the surface contact between the two surfaces is maintained. The theory presented above was intended only for understanding of the phenomenon. In practice, the parts are designed with sufficient safety margins to completely avoid the critical values associated with lockup.

An illustration of two extreme angles provides a good illustration of the crush angle. At an inclination angle α of zero degrees, e.g. two flat plates, there is no possibility of component lockup as it is expected that the forces due to differential thermal expansion will always exceed the frictional forces resisting such expansion even if additional biasing is applied. This is in contrast to an inclination angle of 90° (an interface between an inner and an outer cylinder). In such a case, the effect of expansion or contraction of one component is complete on the other component once there is full contact. Differential expansion or contraction will at first cause an interference stress between the components, but at elevated temperatures and a long stress duration the fracture is likely to occur if such stress has not been accounted for in the design.

In the case of an inclination angle a from zero to nearly 90°, contact between components for thermal transfer is assured. However at the 90° inclination angle shown in the prior art, gaps which are needed for assembly of components create varying rates of transfer of thermal energy between components. The same effects are true when using curved domed shapes, whether they be partially or fully hemispherical. Effective and uniform heat transfer between curved surfaces of rigid members can only be accomplished by using a purely conical surface where the interface angle generally keeps the adjacent components in contact regardless of their displacement relative to one another. Although the two members may be in slightly different relative positions at different temperatures, they can be biased in full contact across the entire temperature range. The weight of the induction coil support member 188 and components attached to it can provide sufficient biasing of the support member 188 against the dome 130 to achieve good thermal contact. However, it is preferred that positive flexible biasing, such as provided by a series of springs, be applied between the coil support member 188 and the dome 130 to assure the desired degree of thermal contact.

The described apex angle of 105° corresponds to an inclination angle of 37½°. In view of the functional form of the critical parameter in Equation. (8) and the desire to extend the RF coil over the plasma processing area, preferred ranges of the inclination angle extend, for example, from 60° down to 30° and possibly 20° or even 10°.

As shown in FIGS. 11 and 12, the coil support 188 includes a conically shaped spiral groove 210 to hold the conically wound plasma-inducing induction wire coil 180. The coil support 188 is preferably made of aluminum nitride, a highly thermally conductive dielectric ceramic, or another similar material with similar heat transfer properties. The coil support 188 is mated to a rigid conically dome-shaped heater sheath 212, preferably made of aluminum nitride to minimize differential thermal expansion with respect to the coil support 188. An electrical heater element 214 embedded in the rigid dome shaped heater housing 212 supplies thermal energy to the conical dome 130. An electrical power source 215 under the control of the automated controller selectively powers the heater element 214. A glue interface 216 thermally and structurally connects the rigid dome shaped heater sheath 212 to the coil support 188. A spiral fin wall 218 between adjacent wraps of the groove 210 in the coil support 188 carries the thermal energy through the center of the coil support 188 to the outer surface 190 of the cone dome 130. The surface area available for conductive heat transfer through the thickness of the coil support 188 is reduced by the surface area taken up by the spiral groove 210, thus increasing the thermal resistance to the transfer of thermal energy through the thickness of the coil support 188.

The conical surfaces between the coil support 188 and the heater sheath 212 allow for some differential thermal expansion. A chiller ring 200 of FIG. 10 differs in minor ways from a chiller ring 200' of FIG. 12, but they have similarly numbered parts and will be simultaneously described. The chiller ring 200, 200' rests on the rigid heater housing 212, or is pressed against it by an urging member such as springs, and/or it is glued to the outside of the rigid heater housing 212. Both the rigid conically shaped heater housing 212 and the chiller ring 200, 200' have angled conically shaped surfaces facing one another for good heat transfer between adjacent surfaces. A cooling fluid passage 220, 220' having a closure plate/ring 222, 222' contains a thermal transfer fluid (such as water) which is pumped through the passage 220, 220'. A pump 221 under the control of the automated controller selectively supplies the chilled water or other thermal transfer fluid to the cooling fluid passage 220, 220'.

As shown in FIG. 10, two O-rings 230, 232 seal the upper portion of the conical dome 130 to an upper sealing ring/plasma guard 234 and to a chamber roof 236, illustrated also in perspective in FIG. 11 and in an enlarged central cross sectional view in FIG. 13. The top of the chamber is closed by the chamber roof 236, which may have a center gas feed through several feed holes 238 in the roof 236.

The combination of a conical wall 130 and a vacuum roof 236 extending above the narrow top of the conical wall 130 is mechanically very strong. The large force exerted by the differential pressure against the roof 236 vertically loads the top of the conical wall 130. This force is decomposed into one aligned with the side of the conical wall 130 and another pressing the annular upper rim of the conical wall 130, both strong mechanical geometries. Pan et al. in U.S. patent application, Ser. No. 08/517,281 filed Aug. 21, 1995, have suggested a plasma chamber having a partially conical roof, but the purpose of the geometry dictates that their top vacuum wall extends well below the upper conical rim, a mechanically unfavorable geometry. The strength advantages of a conical dome persist if a cylindrical chamber at the same pressure is placed above the dome's upper rim.

The roof 236 is selectively heated by a resistance heater in an adjacent heater plate 240 and selectively chilled by water circulating through a spiral channel 242 formed in a chilling plate 244 immediately in back of the heating plate 240. The spiral fluid channel 242 is closed by a top cover 248. However, the heating and cooling can be modified as would be understood by a person of ordinary skill in the art in accordance with any method of temperature controlling a flat plate. Because of the planar geometry, differential thermal expansion does not directly affect the thermal contact between the plates 236, 240, 248. Any slight lateral sliding does not break the thermal interface.

The center gas feed, as illustrated in detailed cross section in FIG. 13, includes a gas feed tube 410 passing through a gas feed plate 412 composed of Invar. A flared end of the gas feed tube 410 holds it to the bottom of the gas feed plate 412. A spring 414 presses the gas feed plate 412 towards the roof 236 in opposition to an elastic O-ring 416 sealing the gas feed plate 412 to the roof 236, thus forming an upper disk-shaped manifold 417 between the gas feed plate 412 and a buffer plate 418. The vertical dimension of the upper manifold 417 is maintained by the flared end of the gas feed tube 410, and the upper manifold is in fluid communication with the feed gas in the gas feed tube 410. The buffer plate 418 is supported on an annular ridge 419 in the roof 236 so as to form a lower disk-shaped manifold 420 between the buffer plate 418 and the roof 236. The buffer plate 418 includes a large number of axial passageways for communicating between the lower and upper disk-shaped manifolds 417, 420. Each of a plurality of feed holes 238 includes a small-diameter lower jet hole 421 at the bottom of the roof 236 and a larger-diameter counterbore 422 at the top. Thereby, gas is distributed from the feed gas tube 410 over a substantial area at the center of the roof 236.

The temperature of the chamber walls need to monitored to take advantage of the thermal control elements of the invention. For example, as shown in the enlarged cross section of FIG. 13, a thermocouple 426 passes through the top cover 248, chiller plate 244, and heater plate 240 and is biased by a spring 428 against the top of the roof 236 to measure its temperature. Further, as shown in the cross section of FIG. 12, another thermocouple 430 is biased by a spring 432 against the outside of the conical dome 130. The outputs of the two thermocouples 426, 430 and any other temperature measuring devices are monitored by the unillustrated automated controller, which is also controlling the electrical powering of various heater units so as to maintain the respective parts within the desired temperature ranges.

In this configuration the accurate sensing and feedback of the temperature to the temperature control circuitry, due to the good thermal heat transfer in the wall of the chamber and the uniform thermal transfer interface between the thermal effects ring and the wall of the chamber, facilitates precise control of the temperature of the wall and roof of the chamber much more tightly than possible in prior art arrangements.

The fine temperature control of both the sidewall 130 and the roof 236 afforded by their respective geometries allow the process to be much better controlled than in other configurations, especially configurations including inductive coupling of RF energy into a high-density plasma. The benefits are particularly advantageous in oxide etching where temperature control of all parts of chamber allow the polymer formation on the wafer to be finely controlled and to be uniform. Changing relative temperatures of the different chamber parts and of the wafer allows the same chamber to be operated in a uniform etch mode, a selective etch mode, a clean mode, and a deposition mode.

An advantage of the geometry of FIG. 10 is that it can produce a much more uniform plasma at higher plasma densities. Exemplary dimensions for the chamber of FIG. 10 are typified in a pedestal 52 having a diameter only slightly larger than an 8-inch (200 mm) wafer, a chamber roof 236 having a diameter of 8½ inches (215 mm), and a spacing between the pedestal 50 and the roof 236 of 4 inches (100 mm). That is, the roof has a diameter within 6% of that of the wafer although nearly the same advantages, to be described below, are expected to be obtained if the diameters differ by no more than 20%.

Ion currents were measured in the conical chamber of FIG. 10 and in the cylindrical chamber of FIG. 7 described by Rice et al. Process conditions were the same in both experiments: 1200 W of RF power applied to the inductive coil, no bias applied to the pedestal or roof, pressure of 8 mT, and a gas flow of 150 sccm of Ar and 9 sccm of $C_4F_8$. The radial distribution of the ion densities are shown in FIG. 16. Plot 230 shows the measured ion density for the cylindrical chamber. The dip at the middle produces an overall uniformity of 7.3%. Plot 232 shows the corresponding values for the conical chamber. The overall uniformity is 3%.

The configuration of FIG. 10 also offers other geometrical advantages. As shown in FIG. 14, the significant slope of the sidewall 182 means that the top area 240 overlying a substrate area 242 near the bottom of the cone has about the same area as the substrate. In contrast, as shown in FIG. 9, a cylindrical chamber produces a much larger top area 126. This becomes important, as discussed below, when a silicon-containing scavenger is placed in the top area 240 and is RF biased.

The chamber roof 236 shown in FIG. 10 can be operated in a number of modes. It can be considered strictly as a dielectric member not directly participating in the processing chemistry. As a dielectric it is preferably formed of undoped polysilicon (actually a moderately resistive semiconductor), silicon carbide, or silicon nitride. If the processing environment allows it, the roof can be made of quartz. A pancake coil or other inductive coil can be placed in back of a dielectric roof 236, consistent with the thermal control elements maintaining the temperature of the roof. The roof 236 can also be made conductive and be electrically grounded or biased so as to participate as an electrode in forming the plasma. The roof 236 may be grounded along with the inner surface of the conical dome 130. If it is electrically biased to a different potential than the dome 130, the plasma guard 234 needs to be formed of an electrically insulating ceramic, such as quartz; but, if the roof 236 is electrically connected to the conical dome 130, the plasma guard 234 may be formed of an electrical conductor, such as silicon carbide. It is possible that the roof 236 be a target formed of a material to be sputtered and sputter deposited on the wafer.

A particular advantage of the configuration of FIG. 10 arises when the roof 236 is RF biased and the roof 236 is approximately the same size as the pedestal 52. It is known that similarly placed roofs, though of larger sizes, can be advantageously made of a silicon-containing material, e.g., either polysilicon or silicon carbide, and used in an oxide etcher using a fluorine chemistry. The silicon acts as a scavenger for fluorine in the plasma and thus causes a polymer depositing on a silicon substrate to be deficient in fluorine. Such a fluorine-deficient polymer is beneficial for an etch process that etches silicon oxide preferentially over silicon. That is, the etching of silicon oxide stops on silicon. However, the silicon-bearing scavenger needs to be activated. It is known that the solid silicon can be thermally activated, but the temperatures involved are several hundred degrees Celsius. Such high temperatures cause a difficult design problem, particularly for vacuum seals around the silicon roof. Alternatively, the silicon roof can be RF biased, and the resulting plasma adjacent to the roof effectively etches it, thus activating the scavenging silicon. Concurrently, the pedestal 50 supporting the wafer is also RF biased to control the plasma etching of the wafer.

As described in the aforecited patent to Ogle et al., power from one RF generator can be split 50:50 between the two electrodes 52, 236. But, as previously discussed, if the counter-electrode 236 facing the wafer is substantially larger than the wafer, the plasma acts as a diode with the larger electrode acting as anode and the smaller one as cathode. As a result, plasma ions are accelerated to the wafer and sputter rather than participate in the soft etch of the wafer. However, if the two electrodes are of substantially the same size, for example, within 25% by area, and the RF power is evenly split between the two electrodes, the diode effect can be avoided, and the RF power level can be adjusted to whatever level provides the optimum DC biasing across the plasma sheath adjacent to the wafer. Other fractions of power splitting are possible and are indeed preferable for oxide etching. The conical dome of the invention is consistent with a silicon-containing roof that is nearly the same size as the wafer. Such an advantage is obtained even in the absence of inductive coupling, for example, with purely capacitive coupling, as done by Ogle et al.

FIG. 17 shows another configuration of the thermal control system according to the invention. The sidewall of the conical dome 130 is heated by a series of heating lamps 260 shining on its outside surface 186 as selectively powered by the automated controller. The radiation from the lamps 260 also shines on the outside of a Teflon cladding 262 encasing the inductive wire coil 262. A shortcoming of this configuration is that the externally located heating lamps 260 heat the wire coil 180 before and simultaneously with heating of the conical dome 130.

The control of the sidewall temperature of the dome 130 is accomplished by the transfer of thermal energy through the conductive conical dome 130. The thermally conductive silicon or silicon carbide conical dome 130 conducts heat down to the lower outer corner 264 of the dome 130, where the dome 130 contacts the lower sealing ring 172, which, as discussed above for FIG. 12, has an integral cooling passage 174 and a closure plate 176 sealing the cooling fluid passage 174. The cooled sealing ring 172 acts as a heat sink for the thermal energy received from the chamber sidewall 130. The silicon or silicon carbide composition of the conical dome 130 provides sufficient thermal conductivity that the temperature gradient along the dome 130 can be kept low and the dome 130 can sink substantial amounts of thermal energy, thus reducing the temperature variations under differing thermal loads.

The temperature gradient from top to bottom in a similarly configured conventional sidewall made of quartz could be as much as 100° C. Such a large variation in the temperature of the chamber sidewall could have a noticeable effect on process uniformity, as the temperature gradient changes over time with continuous processing of substrate from a "cold" start-up. Attempts to control the temperature from one or more sensing locations will always include inaccuracies due to approximations that attempt to model the average internal temperature, without having any effect on the actual extremes high and low limits of the temperature gradient. These inaccuracies are a hurdle to establishing precisely repeatable process parameters. Precisely repeatable process parameters are achievable when using a configuration according to the invention where using a silicon-based thermally conductive material for the sidewall results in a predictable temperature gradient from the top to the bottom of the sidewall of the chamber (whether a conically, cylindrically, or other shaped sidewall) with a maximum gradient in the range of 3 to 5° C. When compared with the possible 100° C. gradient when using quartz, the benefits of precise temperature control are certain to greatly improve the repeatability of substrate processing in the chamber.

FIG. 18 shows yet another configuration of the thermal control system according to the invention of a conical dome 130 according to the invention. In this configuration, a flex heater assembly 270 providing continuous heating of the conical dome 130 includes a heater element 272 interspersed between two polyamide sheaths 274, 276. The automated controller selectively activates the heater element 272. Glue 278 affixes the flex heater assembly 270 to the outside of the conical dome 130. The RF induction coil 262 couples RF energy into the chamber to excite the gas in the chamber to form a plasma at the substrate processing location. The RF induction coil 262 produces closed magnetic lines generally perpendicular to the coil 262, that is, parallel to the inclined surface of the conical dome 130, but the magnetic fields significantly fall off above and below the coil near the curved surface plane of the conical dome, that is, toward the idler and outer rims of the conical dome. The electric field associated with the oscillatory magnetic field excites the plasma, which is oscillating at the RF frequency powering the coil 262. The oscillating electric field generally follows a rotary path about the axis of symmetry of the conical dome 130, as was explained with reference to Equation (2). The rotary electric field produced by the coil 262 could have the effect of inducing electrical current in the adjacent conductive heater element 232, thus potentially shorting out the RF field from the plasma. However, as can be seen from an outside view in FIG. 19 of the coil and transparent heater element, the RF inductive coil 262 is spirally wound but extends principally in the illustrated horizontal direction and produces the rotary electric field also running horizontally in the figure. The configuration is also illustrated in an exploded perspective view in FIG. 20. The heater element 272 is a wire embedded between the polyamide sheaths 274, 276, and the wire 272 principally runs perpendicularly to the RF coil 262 in a back and forth serpentine manner on the surface of the angled portion of the conical dome 130.

Bends 276 or stub connections in the heater element 272 occur outside the area of the RF coil 262 and in areas relatively near to the curved surface to which the coils 262 conforms. In this area, the rotary electric field is minimal.

Advantageously, the conductor of the heater element 272 acts as a Faraday shield positioned around the conical sidewall between the RF coil 262 and the chamber. Such a Faraday shield decouples the capacitive effect of the induction coil, without affecting the electric field inducing effect. Capacitive coupling occurs in an unshielded RF coil 262 because the coil's electrical resistance is finite and voltages of several thousand volts can develop between the two ends of the coil. These voltages can be capacitively coupled across the plasma to grounded chamber parts. However, straight portions 274 of the heater element 272 run directly from the top to the bottom wrap of the RF coil 262 and present lower voltages and a much reduced voltage gradient to the plasma than does the RF coil 262. The straight portions 274 are connected by bends 276 occurring outside of the area of the RF inductive coil 262 but lying generally in the same plane so as to have negligible effect on the electrical and magnetic fields produced by the RF coil 262. Thus, the serpentine heater element 272 extending generally orthogonally to the RF coil 262 has a negligible effect, if any, on the rotary electric field induced by the RF coil 262.

The Faraday shielding effect of the heater element 272 is enhanced by the fact that typically the heater element 272 is electrically powered only when the RF coil 262 is not energized and can be grounded or left floating when the RF coil 262 is energized so that no ohmic voltage drop occurs in it while it is acting as a Faraday shield. This sequencing arises from the use of the heater element 272 to maintain a fairly constant flow of heat into the chamber wall regardless of whether the RF coil 262 is energized or not. Nearly the same good effects can be achieved if the serpentine path of the heater element 272 follows a more sinuous, inclined path, as illustrated in FIG. 22, as long as the bends 276 occur away from the RF coil 262.

FIG. 19 shows an enlarged cross-sectional view of the configuration of the coil 262 and the heater 272 of FIG. 18, and FIG. 20 shows an exploded perspective view, partly in section, of the same. The induction coil wire 262 is routed in a spiral pattern having an approximately uniform pitch between windings. If it is desired to more finely tune the plasma density in the chamber, the coil 262 of FIG. 20 may replaced by another coil 262' as shown in FIG. 21, having a variable pitch configuration for the windings. The dashed lines accompanying the coils 262, 262' as shown in FIGS. 20 and 21 provide a reference guide to the top and bottom edges of a right circular cone providing an imaginary conical reference surface formed by windings of the coils 262, 262'.

As shown in plan view in FIG. 22, because of the conical shape, each of the conically shaped sheaths 274, 276 of polyamide or other flexible material forming the conically shaped heater 270 can be cut from a planar sheet 277. The planar, unbent sheath 274, 274 forms a radial portion of a segment of a circle having for a 360° sheath a segment angle γ of value, when expressed in radians, of $$\gamma = 2\pi \cdot \cos\alpha. \qquad (9)$$

For an conical apex angle β of 105°, the segment angle γ is about 143°. The unbent sheath is bounded by inner and outer arcs 278, 279 having respective radii of $r_1/\cos\alpha$ and $r_2/\cos\alpha$, where $r_1$, and $r_2$ are the inner and outer radii of the conically shaped heater 270, as illustrated in FIG. 20. An inspection of the geometry of FIG. 22 shows that the lengths of the arcs 278, 279 necessarily are respectively $2\pi r_1$, and $2\pi r_2$, thus fitting the conical shape without stretching when the cut sheath 274, 276 is bent into the desired conical shape. Since this condition applies regardless of the value of $r_2$, the entire sheath 274, 276 can be bent into the conical shape without any lateral deformation, that is, any stretching or rippling.

Thus, the conically shaped heater 270 can be fully or partially formed on the flat and thereafter bent into the desired shaped. The only deformation, which should be accommodated within partially elastic polyamide, arises from the finite thickness of the member being bent.

The wire used to form the RF coil 262, 262' tends to be very heavy in order that it reduce the resistive power loss from the very high RF currents impressed on the coil. Often, the coil is a tubular conductor, e.g. copper tubing, and cooling water runs through the tube center to cool the coil. As a result, the RF coil tends to be difficult to wind, particularly in the complex shape required of a conical spiral.

The RF coil can be wrapped into a conically shaped spiral with the aid of a winding jig 280 shown in side view in FIG. 23. The winding jig 280 is formed in the shape of a ziggurat, that is, a generally conical body having a circular or otherwise oblate base. A gentle spiral incline or terrace 282 winds around the jig 280 from bottom to top. The incline surface runs along a path always inclined to the base of the conical body, and its transverse extent is approximately parallel to the base, although a recess may be formed in the incline 282 to conform to the cross section of the induction wire 262. Viewed in cross section, the single incline 282 presents the appearance of multiple steps. The wire as it is wound follows the spiral incline 282 leading around the ziggurat jig. A constant pitch jig is shown, both the axial and radial pitches between successive wraps being constant, but a variable pitch jig follows the same principle.

FIG. 24 shows a single-piece dome 230', another embodiment of the invention.

The cross-sectional view shows an upper portion of the processing chamber made from a single piece of material, e.g., silicon or silicon carbide. The one-piece construction eliminates the need for O-rings at the rim between the conical sidewall and the generally flat top, a possible failure mechanism in the harsh environment associated with an etch reactor.

Two flex heater assemblies 270, 286 are disposed respectively on a conical portion 288 of the dome 230' and on a generally planar roof portion 290. Two cooling rings 292, 294 are disposed respectively at the bottom of the dome 230' and above the flex heater assembly 286 on the roof portion 290 of the dome 230'. The conically shaped flexible heater 270, similar to the description above with reference to FIGS. 18–20, is mounted inside of the RF coil 262. The one-piece dome 230' acts as both the conical dome and roof of the earlier described chambers. The sidewalls 288 are conically shaped, but the inner surface of the conical portion may be more complexly shaped. On the other hand, the top 290 may have a slight arch on its inside surface for mechanical strength but has a planar upper and outer surface for facilitating thermal contact. In general, the height of the arch is limited to 10% of its diameter.

The one-piece dome 230' includes a lower, downwardly extending plasma shield flange 296 and an outwardly extending outer support flange 298. The lower cooling ring 292, which also acts as a sealing ring, is a modification of the lower seal ring 176 described previously with reference to FIG. 12. It includes a cooling fluid passage 300 through which cooling fluid can pass, as well as a channel for a resilient thermal transfer pad 302 and an O-ring 304 as well as a groove 306 to receive a conductive O-ring like element. The configuration also includes the annular roof heater 286 (preferably having a rating of 1.5 kW—similar to the rating of the conical flex heater also having a 1.5 kW rating). The annular roof cooling ring 294, which includes a cooling fluid passage 295, is glued to the amnular flex heater 286 to provide temperature control for the roof. This configuration provides bilateral cooling for the angled surfaces of the chamber.

In this configuration, a cylindrically shaped, secondary coil 308 multiply wrapped along the vertically symmetric axis of the reactor can be placed along the center axis on the top of the one-piece dome 230' to adjust or enhance the magnetic field and resultant electric field and plasma density in the chamber and provide an increase in the uniformity of the plasma density near the center of the wafer in a processing chamber, thereby eliminating the void in the plasma that tends to occur at the center of a plasma generated by a set of surrounding coil windings. The roof coil 308 may be commonly powered with the conical sidewall coil 262, but the power can be selectively split between the two to adjust the plasma density distribution in the chamber. An RF power splitting circuit will be described later. The use of the annular heater ring 286 and annular cooling ring 294 disposed in different areas on the flat roof portion 290 allows the secondary coil 306 to be placed adjacent to the roof portion 290 of the dome 230'. It is of course appreciated that the flat area of the roof portion 290 underlying the heater ring 286 may be stepped from the flat area underlying the secondary coil 306 while still allowing some radial differential expansion.

The secondary coil 308 in combination with the side conical coil 262 of the reactor of FIG. 24 offers many advantages over the pancake coil of FIG. 4. The side coil 262 is the primary coil, typically being RF powered to the level of 2000 to 3000 W to largely support the plasma within the chamber while the secondary coil 308 is used only to tune the field and field uniformity. Its RF power level is in the neighborhood of 500 to 1000 W. Accordingly, the most heat is generated on the mechanically strong conical wall 288, and a lesser amount of heat is generated on the generally flat roof 290, which suffers from a relatively weak mechanical configuration.

The configuration can be modified so that a planar heater pancake be placed above the roof portion 290. The heater pancake may be adapted from the flexible heater assembly 270 of FIG. 18 or the rigid heater element 212 of FIG. 12 with appropriate modifications for the changed geometry. A pancake RF coil may then be placed outside of the heater pancake having a heater wire arranged as a Faraday shield.

Regardless of the configuration, the one-piece dome 230' can be temperature controlled to a fine degree to promote process control and uniformity. The various monitoring and control equipment is not illustrated for the one-piece dome 230' since it does not significantly differ from that of the previously described multi-piece dome.

The heat flow of the invention will now be compared to the prior art. FIG. 25 shows the conceptualized heat flow and temperature gradients across and through the cylindrical sidewall of the processing chamber shown in the prior art configuration of FIG. 7. The large arrowhead arrows 330 represent the thermal energy flow from the processing space within the chamber 332. The vertical chamber wall 334 transfers this thermal energy by conduction to its upper end 336, which is in contact with a roof 338 of the chamber containing cooling elements (not shown). The induction coil 340 supported by grooves of an outside ring 342 are located outside the wall of the chamber. A gap 344 between the outside wall of the chamber and the inside surface of the outside ring 342 restricts the rate of heat transfer directly between the outside ring 342 and the wall 334 of the chamber, but the gap 344 is essential to prevent fracturing that would occur during thermal cycling if there is no gap in the cylindrical geometry. During times when the process is idle, the outside ring 332 is heated by a ring heater clement 346 encircling a lower portion of the outside ring 342. The tapered arrowhead arrows 348 show the flow of thermal energy from the heater clement 346 toward the roof heat sink 350. The gap 344 prevents the uniform and efficient transfer of thermal energy across the gap between the wall 334 of the chamber and the outside ring 342. Furthermore, the chamber wall 334 is typically made of quartz, a poor thermal conductor. Thereby, it becomes difficult to temperature control the chamber wall 334 to prevent large temperature variations, either large spatial gradients or temporal variations during temperature cycling.

FIG. 26 shows the conceptualized heat transfer for the conical configuration of the invention as shown in FIG. 10. The heat flow from the process is again represented by large arrowhead arrows 360. In this configuration, a heat sink 362 is located in a conical cooling ring 364 behind a heater ring 365 and an induction coil 366 and its support ring 368. The thermal energy from the process therefore flows as shown by the stubby arrows—laterally through a wall 370 of the chamber, through the coil support ring 368, through the heater ring 365 and into the cooling ring 364. In the process idle mode, the heater ring 365 is electrically energized, and thermal energy flows as shown by the tapered-arrowhead arrows 374. The closely mating conical surfaces between the heater ring 365, induction coil support ring 368, and chamber wall 370 maintain good thermal contact between the members 365, 368, 370 despite temperature cycling and temperature differences, that produces differential thermal expansion. Furthermore, the heat flow occurs for only relatively short distances over a broad front, thus providing good temperature control for the wall 370 of the chamber during both the idle and process modes.

FIG. 27 shows the conceptualized heat transfer in the embodiment of the resistive thermal blanket shown in detail in FIGS. 18 and 19. The heater blanket 270 is mounted right on the conical wall 130 of the processing chamber inside of the RF coil 262. Heat from both the process during chamber use and from the heater element 270 during times when the process is idle flows through the chamber wall 130. Preferably, the chamber wall 130 in this instance is constructed of a good conductor of thermal energy, such as polysilicon or silicon carbide. The chamber wall 130 conducts the heat laterally to the cooling ring 174 at the base of the wall 130. The highly thermally conductive wall material assures a low magnitude thermal gradient from the top of the wall to the bottom of the wall. The differential is estimated to be in the range of 5 to 20° C.

FIG. 28 shows the conceptualized heat transfer in the one-piece dome 230' shown in FIG. 24. In this configuration, the flow of thermal energy from the process within the chamber flows to the two heat sink rings 292, 294 positioned respectively below and above of the conical portion 288 of the one-piece dome 230'. The one at the base of the chamber wall 288 has a configuration similar to that shown in FIG. 27, and the other one is designed only somewhat differently to accommodate its position on the roof portion of the integrated structure including the chamber wall and roof. The thermal gradients in this configuration are still further reduced from that shown in the configuration of FIG. 27 because the distances over which the thermal energy has to be conducted are substantially reduced. This configuration therefore has the potential to provide very good temperature control of the wall of the chamber.

The various aspects of the invention enables the design, fabrication, and operation of a plasma reactor chamber that is particularly advantageous for oxide etching. As shown in the schematic side illustration in FIG. 29, the plasma within the chamber is supported both inductively and capacitively. An RF power supply 452 supplies RF electrical power to the inductive coil 180 on the outside of the conical dome 130. Another RF power supply 454 supplies RF electrical power between the conductive roof 236 and the pedestal 52 supporting the wafer 50 being etched. Two blocking capacitors 456, 458 block any self-biasing DC voltages developed on the roof 236 and the pedestal 52 from the RF power supply 454. The blocking capacitors are, for example, 1 $\mu$F vacuum capacitors having small impedance in the low-megahertz range of RF typically being used. The automated controller 470 of FIG. 31 activates and sets the power levels for the two RF power supplies 452, 454. For an oxide etching process with a fluorocarbon etchant, both the roof 236 and the conical wall 130 are preferably composed of a fluorine scavenger. For example, the roof 236 may be composed of polysilicon, silicon carbide, or glassy carbon while the conical wall, because it should not be highly conductive, may be composed of polysilicon or silicon carbide. The choice of material and its conductivity depends upon the mode of operation expected of the reactor. A silicon or silicon carbide ring 460 surrounds the pedestal 52 so that the plasma interacts with a silicon-containing material rather than one containing metal contaminants. A collar 462 of silicon carbide or quartz, although silicon carbide has a longer lifetime, is fit into an annular recess of the pedestal 52 around the outer periphery of the wafer 50 so as to protect the pedestal 52 from the plasma.

The scavenging of the roof 236 is activated by RF biasing rather than thermal energy because the electrode RF power supply 454 can selectively split power between the two electrodes 52, 236. The power splitting, schematically illustrated in FIG. 30, divides the RF power between the wafer pedestal 52 and the roof 236. A standard RF power supply 464 is connected through an unillustrated RF matching circuit to the primary of a splitting circuit 466, such as a wide-band 1:1 electrical transformer which includes a several taps on its secondary that can be selectively grounded through a commutator switch 468. The grounding potential of the transformer 466 is referenced to the conical wall 130, which is also grounded. However, other fixed voltages can be used to reference the transformer 466. Because of the blocking capacitors 456, 458, the transformer ground is used to split power and not to control the DC potential on the electrodes 52, 236. The position of the switch 468 determines the splitting ratio of the RF power supplied to the pedestal 52 and to the roof 236. Other types of RF power splitting can be used, as is well known. The conventional power splitting ratio, as taught by Ogle et al., is 50:50, but for oxide etching as applied to this invention lower splitting ratios are preferable, that is, more RF power is delivered to the pedestal 52 than to the roof electrode 236.

With a substantial amount of RF bias applied to the roof 236, the silicon in the roof 236 is activated. Thereby, the roof 236 can be kept at a lower temperature than is possible when relying upon thermal activation of itself. The low operating temperatures provided by the invention relax the thermal requirements of the system, thus simplifying its design and increasing the lifetimes of its parts. Also, since the fluorine scavenging is controlled by the RF energy applied to the counter-electrode rather than by the temperature assumed by the counter-electrode during complex thermal cycling, the etching process can be more definitely controlled. Furthermore, the tight temperature control of the conical wall 130 and other parts provided by the invention also allows more complete control of the etching process.

The conically shaped wall is directly related to the superior scavenging control and thus selectivity afforded by the reactor for oxide etching. The conical shape not only allows the side inductive coupling to overlie the wafer and thus increase plasma uniformity, but also accommodates a counter-electrode that is approximately the same size as the wafer being etched. As a result, the diode effect can be reduced, thus producing a lower-energy flux of excited etchant particles. Also, the smaller size of the counter-electrode, when it is composed of a fluorine-scavenging material, allows a relatively small amount of RF power split to the counter-electrode to adequately activate the scavenging species. Power splitting ratios of 10:90, 20:80, and 25:75 have been tested. The 20:80 power splitting ratio produces the best selectivity and a wide process window without etch stopping. The RF activation of the silicon scavenger also allowed operation at much lower temperatures, tests having been extended down to roof temperatures in the range of 135~140° C. A bi-level process has been achieved with roof temperatures in the 140 to 180° C. range, although 150° C. is preferred.

An automated controller 470 illustrated in the block diagram of FIG. 31 controls the plasma etching reactor. Selected amounts of RF power are applied to the chamber to activate the plasma through the RF power supplies 452, 434. The temperature is monitored from the two thermocouples 426, 430. In response to both the applied RF power and the measured temperatures, chilling water is selectively pumped by pumps 173, 221 and heat is injected through the heater supply 215. Of course, a differing number of thermal control elements and RF supplies may be used within the spirit of the invention. The automated controller 470 also controls the process gas flow, vacuum pumping, and other process parameters. The automated controller 470 follows a process recipe input to it on a transferrable recordable medium 472, such as a floppy disk or a CD-ROM, or input over a communication link 474. The configuration can be modified so that a planar heater pancake be placed above the roof portion 290. The heater pancake may be adapted from the flexible heater assembly 270 of FIG. 18 or the rigid heater element 212 of FIG. 12 with appropriate modifications for the changed geometry. A pancake RF coil may then be placed outside of the heater pancake having a heater wire arranged as a Faraday shield.

There are many variations and combinations of the previously described reactors which offer distinct advantages in different applications.

A related design, illustrated in the schematical cross-sectional view of FIG. 32 is adapted from the multi-piece chamber of FIGS. 10 and 11 but incorporates powering features of the single-piece chamber of FIG. 24. A secondary coil 308 is placed in back of the disk-shaped roof 236 while the primary coil 180 is placed in back of the conical dome 130, preferably principally formed of sintered silicon carbide with a resistivity of greater than $10^5 \Omega$-cm. The secondary coil 308 can have a solenoidal shape, as illustrated, or may be a pancake coil, as in FIG. 4. The secondary coil 308 is intended to tune the magnetic field and the plasma distribution within the chamber by inductively coupling a relatively small amount of RF power through the roof 236 while the primary coil 180 inductively couples the major part of the RF power into the chamber through the conical dome 130. RF power ratios of 3:1 to 4:1 are typical, as was explained for the reactor of FIG. 24.

The roof 236 may be principally formed of insulating silicon carbide with a perhaps a thin surface layer of conductive CVD silicon carbide to effect either grounding or capacitive biasing. In a simpler design, the roof 236 may be formed of polysilicon with resistivity in the neighborhood of 20 to 40$\Omega$-cm so that it both passes the magnetic field from the secondary coil 308 while also maintaining a grounding plane or RF biased electrode. However, polysilicon is a relatively fragile material and large flat shape is mechanically weak. Thermal stresses to the polysilicon roof 236 need to be minimized between periods of operation and inactivity. The reduced power delivered to the secondary coil 308 does reduce the stresses to the roof 236 while the larger thermal stress associated with the primary coil 180 is delivered to the stronger conical dome 130 of more robust material. Hence, even greater advantages are obtained by the reduced power delivered to the secondary coil in back of the silicon roof 236.

The conical dome may be applied to reactors not utilizing RF inductive coupling. In the reactor illustrated in FIG. 33, both the conical dome 130 and the roof 236 arc formed of conductive materials and are grounded while the pedestal 52 is powered by the RF source 56. This configuration is useful for standard reactive ion etching (RIE). In the reactor illustrated in FIG. 34, the conical dome 136 is grounded, and the power splitting RF source 454 is connected between the roof 236 and the pedestal 52 and delivers RF power to both of them. This configuration is useful for power split RIE, similar to that described in the aforecited patent to Ogle et al.

The various configurations involving the conical dome demonstrates that one basic design can be implemented for a number of distinctly different processes. Different chambers may be designed with minor modifications from a generic design, thus simplifying the design and reducing the parts count. Alternatively, a single chamber can be used in a number of process modes by simply adjusting the electrical biasing conditions, both the capacitively coupled roof 236, conical dome 130, and pedestal 52 and the inductively coupled primary coil 180 and second coil 308.

An example of a universal chamber is schematically illustrated in the cross-sectional view of FIG. 35. A switch 480 can direct the RF power from the capacitive RF source 464 either solely to the pedestal 52 or to the conical wall 130 or can direct it through the power-splitting circuit 466 to between the roof 236 and the pedestal 52. It may be useful to RF bias the wall 130, for example, to clean it. A switch 482 connected to the pedestal 52 can selectively connect it to either ground, directly to the RF power source 464, or to the electrode power splitting circuit 466. Similarly, a switch 484 connected to the conductive inner wall of the composite silicon carbide conical dome 130 can bias the conical dome 136 either to ground, to a floating position, or directly to the RF power source 464. A switch 236 connected to the roof 236 selectively grounds the roof or biases it through the electrode power splitting circuit 466. In the universal embodiment, the roof 236 must be electrically biasable and transmit RF power from the secondary coil 308. Thus, it may be formed of resistive polysilicon or of resistive sintered silicon carbide with a conductive CVD coating of silicon carbide on its interior. The inductive RF power source 452 is selectively connected through a switch 488 to a coil power splitting circuit 490 which selectively splits the RF current between the primary coil 180 outside the conical dome 130 and the secondary coil 308 atop the roof 236 in a proportion to optimize the magnetic field distribution inside the chamber. The controller 470 selects the positions of the switches 480, 482, 486, 488 and the power-splitting ratios of the power-splitting circuits 466, 490. It is understood that grounding in the context of an RF plasma reactor includes biasing the part at a predetermined DC potential. It is also understood that FIG. 35 is intended to be only schematical in form and the actual electrical circuitry may be of different form while providing equivalent functionality.

The use of the automated controller 470 enables an inventive method of controlling the temperature of a wall of a plasma vacuum processing chamber. The method includes the steps of providing a sidewall of the vacuum processing chamber preferably composed of a polysilicon or silicon carbide having a bulk thermal conductivity greater than a similarly configured sidewall constructed of quartz. The sidewall has a first surface facing a substrate processing location in the chamber and an outer second surface opposite the first surface. Preferably, the second surface is conically shaped. A heating member is placed in thermal contact with a second side of the sidewall, having a primary orientation of a heater element pattern routed in a back and forth pattern with a substantial portion of the pattern of the heater element running approximately parallel to one another. The chamber is provided with a induction coil running generally circularly around the first surface of the chamber wall, and an RF power source is selectively controlled to at least partially energize a processing plasma in the chamber. The heater element is controlled by an electrical source to provide an input of thermal power to the sidewall approximately equal to the thermal power input received in the wall from the RF coil as well as other contributions from the plasma formed within the processing chamber. The main portions of the heating wire of the heater element are configured to run approximately perpendicular to the induction coil with parallel portions near the induction coil being connected by bends located away from the induction coil. A cooling ring is placed adjacent to one or more ends of the sidewall, and a planar or conical connection between the sidewall and the cooling ring is established to provide thermal and electrical conductivity between them. The cooling ring includes a cooling fluid passage to provide the transfer of thermal energy between the cooling ring and a thermal transfer fluid passing therethrough. Thermal transfer fluid is run continuously through the cooling fluid passage. The temperature of the sidewall is maintained nearly constant by not providing power to the heater element when there is no plasma present in the processing chamber and providing power to the heater element when there is no plasma present in the processing chamber. Preferably, the heater wire is positioned between the induction coil and the chamber wall so as to act as a Faraday shield.

Another embodiment of a method of maintaining a temperature of a sidewall of a processing chamber comprises the steps of providing a chamber side wall; providing an induction coil around the sidewall, the wire of the coil wrapped around and being configured perpendicular to a central axis of the chamber; providing a heater clement between the coil and the sidewall, the heater clement having a pattern where a substantial portion of the element runs approximately parallel to the central axis of the chamber and perpendicular to the wire in the coil.

The inventive conical shape of the chamber thus provides numerous processing advantages, particularly for temperature control and plasma uniformity, in a mechanical structure that is strong and easily manufactured. Other inventive features complement the use of such a conical plasma chamber, particularly for use as an oxide etch reactor.

Although the invention is particularly useful for oxide etchers, it can easily be adapted to reactors intended for etching other materials. Furthermore, most aspects of the invention can be applied to reactors intended for chemical vapor deposition, which shares many mechanisms with etching. Some aspects of the invention can be applied to other vacuum processing equipment, especially as used for semiconductor fabrication.

While the invention is described with regards to specific embodiments, those skilled in the art will recognize that change can be made in form and detail without departing from the spirit and scope of the invention.

What is claimed is:

1. A plasma vacuum processing chamber comprising:
   a chamber wall having a conical portion with an inner wall surface facing a substrate processing location in the chamber and with a conically shaped outer wall surface opposite said inner wall surface;
   a conically shaped induction coil having multiple progressively expanding windings disposed proximate to said outer surface;
   an electrically conductive support ring having an annular ledge supporting a lower rim of said chamber wall and an annular wall surrounding an outside of said lower rim and having an annular groove formed therein facing said lower rim; and
   a conductive spring member fit in said groove and contacting said lower rim.

2. The plasma vacuum processing chamber as in claim 1, wherein said support ring further includes a generally annular fluid cooling channel formed therein.

3. A plasma vacuum processing chamber, comprising:
   a chamber wall having a conical portion with an inner wall surface facing a substrate processing location in the chamber and with a conically shaped outer wall surface opposite said inner wall surface; and
   a conically shaped induction coil having multiple progressively expanding windings disposed proximate to said outer surface;
   a roof of said chamber disposed over an end of said conical portion opposite said processing location, wherein said roof includes a substantially flat outer surface portion
   a second induction coil placed over said roof; and
   a thermal control element contacting said roof in said substantially flat outer surface portion.

4. A plasma vacuum processing chamber, comprising:
   a chamber wall having a conical portion with an inner wall surface facing a substrate processing location in the chamber and with a conically shaped outer wall surface opposite said inner wall surface;
   a conically shaped induction coil having multiple progressively expanding windings disposed proximate to said outer wall surface:
   a roof member forming the top of a truncated edge of said conical portion of said wall, wherein an inner side of said roof member is exposed to said substrate processing location and said roof member has an outer side opposite said inner side; and
   a helical wire coil cylindrically wound about a cylindrical axis, said helical wire coil being disposed in proximity to said outer side of said roof member approximately centered within said truncated edge of said cone portion with an end of said cylindrical axis of said helical wire coil pointing toward an approximate center of said substrate processing location.

5. The plasma vacuum processing chamber as in claim 4, wherein the roof member is integral with said conical portion of said chamber wall forming a roof cone member.

6. The plasma vacuum processing chamber as in claim 4, wherein said roof cone member is formed of polysilicon material.

7. The plasma vacuum processing chamber as in claim 4, wherein said roof cone member is formed of silicon carbide material.

8. The plasma vacuum processing chamber as in claim 4, wherein an end of said helical wire coil is connected in series to an end of said conically shaped induction coil.

9. The plasma vacuum processing chamber as in claim 8, wherein a coil power splitting circuit is provided to set the effect of the electric field induced by the helical wire coil in comparison to the electrical field induced by the conically shaped induction coil.

10. The plasma vacuum processing chamber as in claim 4, wherein the helical wire coil is supplied with RF power.

11. The plasma vacuum processing chamber as in claim 4, further comprising at least one thermal control unit being disposed on said outer side of said roof member radially outwardly of said helical wire coil from said cylindrical axis.

12. A plasma vacuum processing chamber, comprising:
   a chamber wall having a conical portion with an inner wall surface facing a substrate processing location in the chamber and with a conically shaped outer wall surface conforming to a cone having a cone apex angle and opposite said inner wall surface; and
   a conically shaped induction coil having multiple progressively expanding windings disposed proximate to said outer surface,
      wherein said induction coil is housed inside of a thermally conductive substantially rigid dielectric member having a conically shaped inside surface configured to provide surface contact for heat transfer between said outer wall surface of said chamber wall and said inside surface of said dielectric member, wherein said cone apex angle has a sufficiently large value to allow a sliding movement between the outer wall surface of said chamber wall and the inside conical surface of said dielectric member to accommodate motion due to changes and differences in temperatures between the chamber wall and the dielectric member.

13. The plasma vacuum processing chamber as in claim 12, wherein said dielectric member comprises a ceramic body.

14. The plasma vacuum processing chamber as in claim 12, wherein said dielectric member includes a heating element to heat said member and said side wall, said heating element being disposed outside said induction coil.

15. The plasma vacuum processing chamber as in claim 14, wherein said heating element is embedded in at least one outwardly facing groove of an outer cone shaped ring portion of said dielectric member, which is fixed to an inside cone shaped ring member through a thermally transmissive connection.

16. The plasma vacuum processing chamber as in claim 14, wherein a cooling ring is attached to an outside surface of said dielectric member, said cooling ring being in thermal contact with said dielectric member, said cooling ring having a cooling fluid passage therethrough to pass a thermal transfer fluid.

17. The plasma vacuum processing chamber as in claim 12, wherein a cooling ring is attached to an outside surface of said dielectric member, said cooling ring being in thermal contact with said dielectric member, said cooling ring having a cooling fluid passage therethrough to pass a thermal transfer fluid.

18. The plasma processing chamber as in claim 12, wherein said induction coil is not exposed through said conically shaped inside surface of said rigid dielectric member.

19. The plasma vacuum processing chamber as in claim 12, wherein said dielectric member is substantially unconstrained with respect to said chamber wall in a direction allowing said sliding movement accommodating said motion.

20. A plasma vacuum processing chamber, comprising:
   a chamber wall having a truncated conical portion with an inner wall surface facing a substrate processing location in the chamber, with a conically shaped outer wall surface opposite said inner wall surface, and with a roof portion positioned on a truncated end of said truncated conical portion, wherein said chamber wall comprises a conically shaped dielectric chamber sidewall having a first surface facing a substrate processing location in said chamber and a second surface opposite said first surface;
   a conically shaped induction coil having multiple progressively expanding windings disposed proximate to said outer surface;
   a heating member in thermal contact with a second side of said sidewall, wherein said induction coil is configured to surround said chamber sidewall and said heating member, said coil being disposed and configured when energized to induce a gas at said substrate processing location to form a plasma; and
   a cooling ring disposed adjacent to an end of said sidewall opposite said roof portion, wherein a connection between said sidewall and said cooling ring is established to provide thermal conductivity between them, wherein said cooling ring includes a cooling fluid passage to provide the transfer of thermal energy between the cooling ring and a thermal transfer fluid passing therethrough.

21. The plasma vacuum processing chamber as in claim 20, wherein said dielectric chamber sidewall is constructed of a silicon-containing material.

22. The plasma vacuum processing chamber as in claim 20, wherein said heating member contains an electrically powered conductive heater element.

23. A plasma processing chamber, comprising:
   a vacuum chamber having a side wall;
   an induction coil wrapped around said side wall; and
   a heater positioned adjacent to said induction coil and to said side wall and comprising a heater wire comprising substantially straight portions running substantially perpendicular to said induction coil and a plurality of bent portions connecting said straight portions positioned further away from said induction coil than central parts of said straight portions, thereby forming a Faraday shield operative between said induction coil and said vacuum chamber.

24. The plasma processing chamber of claim 23, wherein said side wall is conically shaped.

25. The plasma processing chamber of claim 24, wherein said heating wire of said heater is disposed between said induction coil and said side wall.

26. The plasma processing chamber of claim 23, wherein said heating wire of said heater is disposed between said induction coil and said side wall.

27. The plasma processing chamber of claim 23, wherein said straight portions of said heater wire run next to said side wall.

28. A plasma vacuum processing chamber, comprising:
   a chamber wall having a portion with an inner wall surface facing a substrate processing location in the chamber and with a conically shaped outer wall surface opposite said inner wall surface;
   a conically shaped induction coil having multiple progressively expanding windings disposed proximate to said conically shaped out wall surface; and
   a thermally conductive substantially rigid dielectric member having an inner conical surface in sliding contact with said conically shaped outer wall surface and housing said induction coil in an interior thereof.

29. The plasma vacuum processing chamber as in claim 28, wherein said dielectric member has at least one groove formed in a side opposite said inner conical surface accomodating said induction coil.

30. A plasma vacuum processing chamber, comprising:
   a chamber wall having a conical portion with an inner wall surface facing a substrate processing location in the chamber and with a conically shaped outer wall surface opposite said inner wall surface;
   a conically shaped induction coil having multiple progressively expanding windings disposed proximate to said outer surface; and
   a thermally conductive substantially rigid dielectric member having an inner wall surface adjacent said conically shaped outer wall surface and having at least one groove on a side opposite said inner wall surface accomodating said induction coil.

31. The plasma vacuum processing chamber of claim 30, wherein said inner wall surface is in sliding contact with said conically shaped outer wall surface.

* * * * *